(12) United States Patent
Kang et al.

(10) Patent No.: US 12,374,667 B2
(45) Date of Patent: Jul. 29, 2025

(54) SEMICONDUCTOR PACKAGE AND METHOD OF MANUFACTURING THE SAME

(71) Applicant: Samsung Electronics Co., Ltd., Suwon-si (KR)

(72) Inventors: Junghoon Kang, Anyang-si (KR); Byungmin Yu, Sejong-si (KR); Junghyun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 445 days.

(21) Appl. No.: 17/840,744

(22) Filed: Jun. 15, 2022

(65) Prior Publication Data

US 2023/0146085 A1    May 11, 2023

(30) Foreign Application Priority Data

Nov. 9, 2021  (KR) .................. 10-2021-0153340

(51) Int. Cl.
*H01L 23/498* (2006.01)
*H01L 23/00* (2006.01)
(Continued)

(52) U.S. Cl.
CPC ........ *H01L 25/105* (2013.01); *H01L 23/3128* (2013.01); *H01L 23/49811* (2013.01);
(Continued)

(58) Field of Classification Search
CPC ......... H01L 27/14623; H01L 27/14634; H01L 27/14636; H01L 27/14685; H01L 27/1469;
(Continued)

(56) References Cited

U.S. PATENT DOCUMENTS 9,167,694 B2   10/2015  Sundaram et al.
9,472,425 B2 *  10/2016  Song ................... H05K 1/185
(Continued)

FOREIGN PATENT DOCUMENTS

KR    100942635 B1    2/2010
KR    101947251 B1    2/2019

*Primary Examiner* — Vu A Vu
(74) *Attorney, Agent, or Firm* — Harness, Dickey & Pierce, P.L.C.

(57) ABSTRACT

A semiconductor package includes: a lower redistribution structure including a lower redistribution insulation layer, a bump pad in the lower redistribution insulation layer, and a lower redistribution pattern electrically connected to the bump pad, wherein the lower redistribution insulation layer includes: one or more sidewalls at least partially defining a cavity extending from a bottom surface of the lower redistribution insulation layer to an upper surface of the lower redistribution insulation layer; a passive component in the cavity of the lower redistribution insulation layer; an insulation filler in the cavity of the lower redistribution insulation layer, the insulation filler covering sidewalls of the passive component; a first semiconductor chip on the lower redistribution structure, the first semiconductor chip electrically connected to both the lower redistribution pattern and the passive component; and an external connection bump connected to the bump pad via a pad opening of the lower redistribution insulation layer.

20 Claims, 19 Drawing Sheets

(51) Int. Cl.
*H01L 23/31* (2006.01)
*H01L 23/538* (2006.01)
*H01L 25/10* (2006.01)

(52) U.S. Cl.
CPC .. *H01L 23/49822* (2013.01); *H01L 23/49838* (2013.01); *H01L 23/5385* (2013.01); *H01L 24/16* (2013.01); *H01L 24/05* (2013.01); *H01L 24/13* (2013.01); *H01L 24/81* (2013.01); *H01L 2224/0401* (2013.01); *H01L 2224/05599* (2013.01); *H01L 2224/13099* (2013.01); *H01L 2224/16227* (2013.01); *H01L 2224/81399* (2013.01)

(58) Field of Classification Search
CPC ..... H01L 27/146; H01L 23/552; H01L 25/18; H01L 27/1462; H01L 27/14625; H01L 27/1463; H04N 25/70; H04N 25/616; H04N 25/76
USPC ........................................................ 257/668
See application file for complete search history.

(56) References Cited

U.S. PATENT DOCUMENTS

| | | | |
|---|---|---|---|
| 10,163,798 | B1 | 12/2018 | Alur et al. |
| 10,475,718 | B2 | 11/2019 | Chen et al. |
| 10,497,847 | B2 * | 12/2019 | Liu .................. H01L 33/62 |
| 10,714,434 | B1 | 7/2020 | Pietambaram et al. |
| 10,797,031 | B2 | 10/2020 | Liao et al. |
| 10,968,348 | B2 | 4/2021 | Liu et al. |
| 11,031,328 | B2 | 6/2021 | Cho et al. |
| 11,088,124 | B2 | 8/2021 | Chen et al. |
| 11,189,596 | B2 * | 11/2021 | Chen .................. H01L 25/16 |
| 11,380,620 | B2 * | 7/2022 | Wu .................. H01L 23/16 |
| 11,444,051 | B2 * | 9/2022 | Sandstrom ........... H01L 25/105 |
| 2017/0018525 | A1 | 1/2017 | Dias et al. |
| 2018/0294255 | A1 | 10/2018 | Liu |
| 2020/0194381 | A1 | 6/2020 | Park |
| 2020/0243450 | A1 | 7/2020 | Cho et al. |
| 2023/0137841 | A1 * | 5/2023 | Lau .................. H05K 3/4682 361/767 |

* cited by examiner

SEMICONDUCTOR PACKAGE AND METHOD OF MANUFACTURING THE SAME

CROSS-REFERENCE TO RELATED APPLICATION

This application is based on and claims priority under 35 U.S.C. § 119 to Korean Patent Application No. 10-2021-0153340, filed on Nov. 9, 2021 in the Korean Intellectual Property Office, the disclosure of which is incorporated by reference herein in its entirety.

BACKGROUND

The inventive concepts relate to semiconductor packages and methods of manufacturing the semiconductor packages.

Recently, demand on portable devices has rapidly increased in the electronic products market, and accordingly, miniaturization and lightweight of electronic components mounted on electronic products has been continuously required. For the miniaturization and lightweight of the electronic components, semiconductor packages mounted thereon are required to process a large amount of data while a volume thereof is decreased. Recently, a wafer level package technique and a panel level package technique have been introduced, in which a semiconductor package process is performed at a wafer level (or, a panel level), and semiconductor structures at a wafer level (or, a panel level) having completed the semiconductor package process are separated into individual packages.

SUMMARY

The inventive concepts provide one or more semiconductor packages and/or one or more methods of manufacturing one or more semiconductor packages.

According to some example embodiments of the inventive concepts, a semiconductor package may include: a lower redistribution structure including a lower redistribution insulation layer, a bump pad in the lower redistribution insulation layer, and a lower redistribution pattern electrically connected to the bump pad, wherein the lower redistribution insulation layer includes one or more sidewalls at least partially defining a cavity extending from a bottom surface of the lower redistribution insulation layer to an upper surface of the lower redistribution insulation layer; a passive component in the cavity of the lower redistribution insulation layer; an insulation filler in the cavity of the lower redistribution insulation layer, the insulating filler covering sidewalls of the passive component; a first semiconductor chip on the lower redistribution structure, the first semiconductor chip electrically connected to both the lower redistribution pattern and the passive component; and an external connection bump connected to the bump pad via a pad opening of the lower redistribution insulation layer, the external connection bump connected to the bottom surface of the lower redistribution insulation layer, wherein the insulation filler may include a bottom surface exposed to an exterior of the semiconductor package through the bottom surface of the lower redistribution insulation layer, and a surface roughness of the bottom surface of the lower redistribution insulation layer may be greater than a surface roughness of the bottom surface of the insulation filler.

According to some example embodiments of the inventive concepts, a semiconductor package may include: a lower redistribution structure including a lower redistribution insulation layer, a bump pad in the lower redistribution insulation layer, and a lower redistribution pattern electrically connected to the bump pad, wherein the lower redistribution insulation layer includes one or more sidewalls at least partially defining a cavity extending from a bottom surface of the lower redistribution insulation layer to an upper surface of the lower redistribution insulation layer; a passive component in the cavity of the lower redistribution insulation layer; an insulation filler in the cavity of the lower redistribution insulation layer, the insulation filler covering sidewalls of the passive component; a semiconductor chip on the lower redistribution structure, the first semiconductor chip electrically connected both to the lower redistribution pattern and the passive component; and an external connection bump connected to the bump pad through a pad opening of the lower redistribution insulation layer, the external connection bump connected to the bottom surface of the lower redistribution insulation layer, wherein a surface roughness of the bottom surface of the lower redistribution insulation layer may be greater than a surface roughness of the upper surface of the lower redistribution insulation layer.

According to some example embodiments of the inventive concepts, a semiconductor package may include: a lower package and an upper package stacked on the lower package, wherein the lower package includes: a lower redistribution structure including a lower redistribution insulation layer, a bump pad in the lower redistribution insulation layer, and a lower redistribution pattern electrically connected to the bump pad, wherein the lower redistribution insulation layer includes one or more sidewalls at least partially defining a cavity extending from a bottom surface of the lower redistribution insulation layer to an upper surface of the lower redistribution insulation layer; a passive component in the cavity of the lower redistribution insulation layer; an insulation filler in the cavity of the lower redistribution insulation layer, the insulation fillers covering sidewalls of the passive component; a first semiconductor chip on the lower redistribution structure, the first semiconductor chip electrically connected to both the lower redistribution pattern and the passive component; a chip connection bump between the lower redistribution structure and a first chip pad of the first semiconductor chip; a conductive connection pillar attached to a connection pad of the passive component; a component connection bump between the conductive connection pillar and a second chip pad of the first semiconductor chip; a molding layer on the lower redistribution structure, the molding layer covering the first semiconductor chip; a conductive post penetrating the molding layer, the conductive post electrically connected to the lower redistribution pattern; an upper redistribution structure on the molding layer, the upper redistribution structure including an upper redistribution insulation layer and an upper redistribution pattern electrically connected to the conductive post; and an external connection bump connected to the bump pad through a pad opening of the lower redistribution insulation layer, the external connection bump connected to the bottom surface of the lower redistribution insulation layer, wherein the upper package includes: a package substrate stacked on the upper redistribution structure via an inter-package connection terminal; and a second semiconductor chip on the package substrate, wherein the insulation filler includes a bottom surface exposed to an exterior of the semiconductor package through the bottom surface of the lower redistribution insulation layer, and wherein a surface roughness of the bottom surface of the lower redistribution insulation layer is greater than both a surface roughness of the bottom surface of the insulation filler and a surface roughness of the upper surface of the lower redistribution insulation layer.

According to some example embodiments of the inventive concepts, a method of manufacturing a semiconductor package may include: forming a lower redistribution structure on a carrier substrate, the lower redistribution structure including a lower redistribution insulation layer, a bump pad, and a lower redistribution pattern; forming a cavity in the lower redistribution structure such that the cavity is at least partially defined by one or more sidewalls of the lower redistribution structure; inserting a passive component into the cavity of the lower redistribution structure; forming an insulation filler filling the cavity of the lower redistribution structure, and covering the passive component; mounting a semiconductor chip on the lower redistribution structure; and separating the carrier substrate from the lower redistribution structure, wherein the forming of the cavity in the lower redistribution structure includes: forming a cutting region defining a removal structure of the lower redistribution structure by removing a portion of the lower redistribution structure; attaching a debonding film on the lower redistribution structure; irradiating a first laser beam on an interface between the removal structure and the carrier substrate through the carrier substrate; and separating the debonding film and the removal structure attached to the debonding film from the lower redistribution structure.

BRIEF DESCRIPTION OF THE DRAWINGS

Example embodiments of the inventive concepts will be more clearly understood from the following detailed description taken in conjunction with the accompanying drawings in which:

FIGS. 5A, 5B, 5C, 5D, 5E, 5F, 5G, 5H, 5I, 5J, 5K, 5L, 5M, 5N, and 5O are cross-sectional views illustrating a method of manufacturing a semiconductor package, according to some example embodiments.

DETAILED DESCRIPTION

Figure 1:
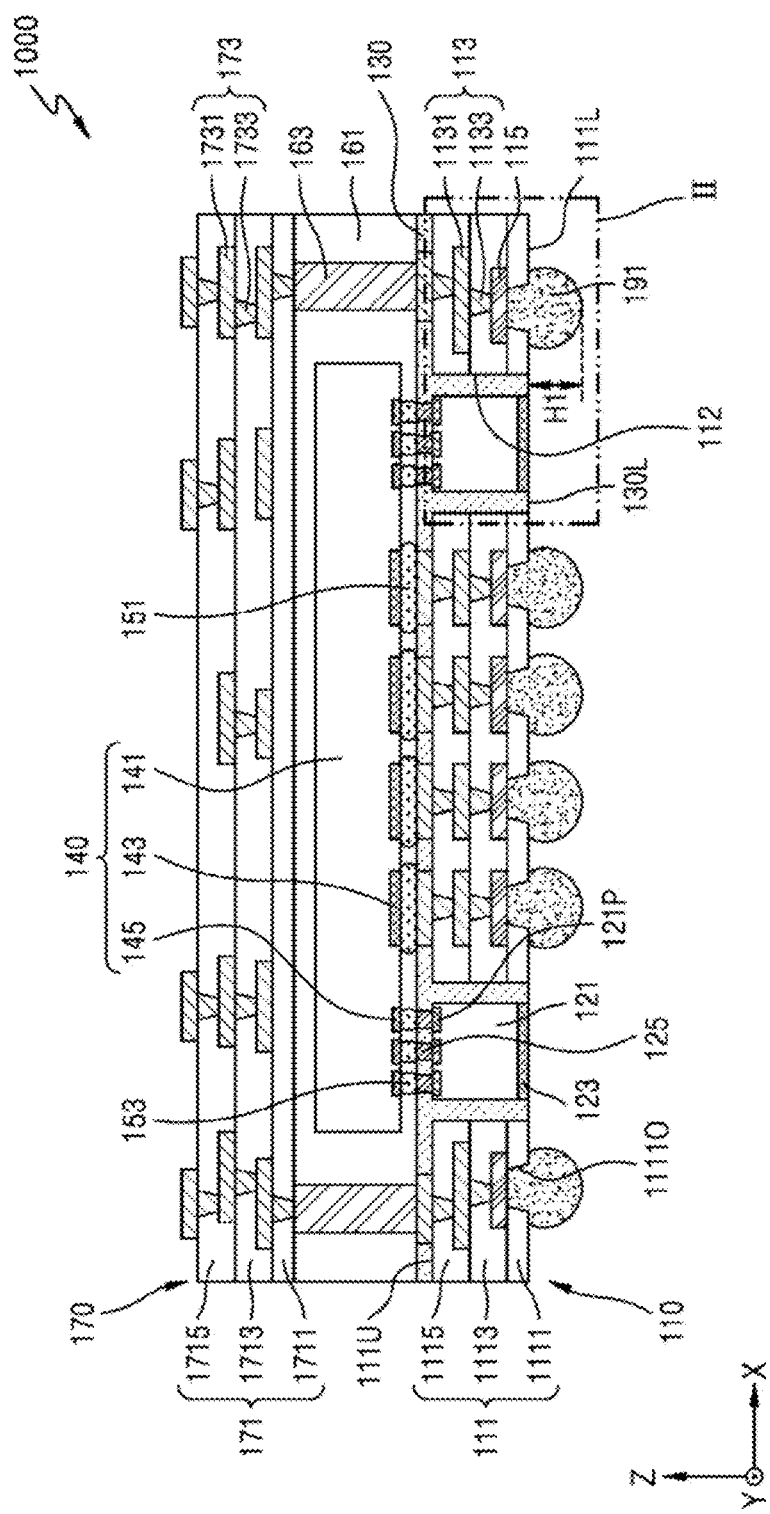
FIG. 1 is a cross-sectional view of a semiconductor package according to some example embodiments.

Hereinafter, some example embodiments of the inventive concepts are described in detail with reference to the accompanying drawings. Identical reference numerals are used for the same constituent elements in the drawings, and duplicate descriptions thereof are omitted.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, elements that are described to be in contact with other elements may be understood to be in "direct" contact with the other elements. As described herein, elements that are described to be exposed (e.g., to an exterior of the semiconductor package 1000) may be understood to be "directly" exposed (e.g., to an exterior of the semiconductor package 1000).

As described herein, when an operation is described to be performed "by" performing additional operations, it will be understood that the operation may be performed "based on" the additional operations, which may include performing said additional operations alone or in combination with other further additional operations.

Figure 2:
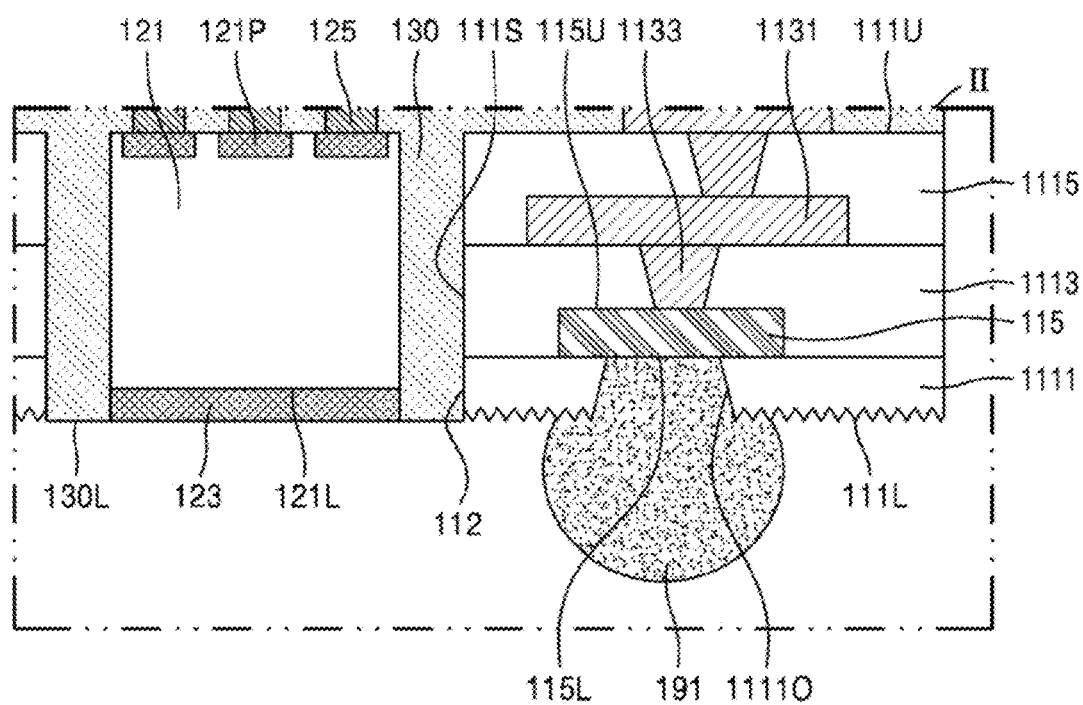
FIG. 2 is an enlarged diagram of region II in FIG. 1 according to some example embodiments.

FIG. 1 is a cross-sectional view of a semiconductor package 1000 according to some example embodiments. FIG. 2 is an enlarged diagram of region II in FIG. 1 according to some example embodiments.

Referring to FIGS. 1 and 2, the semiconductor package 1000 may include a lower redistribution structure 110, an insulation filler 130, a passive component 121, a first semiconductor chip 140, a molding layer 161, a conductive post 163, and an upper redistribution structure 170.

The semiconductor package 1000 may include a fan out semiconductor package, in which a footprint of the lower redistribution structure 110 is greater than a footprint of the first semiconductor chip 140. The footprint of the lower redistribution structure 110 may be the same as a footprint of the semiconductor package 1000.

The lower redistribution structure 110 may include a lower redistribution insulation layer 111, a lower redistribution pattern 113, and a bump pad 115. The lower redistribution structure 110 may include a substrate, on which the first semiconductor chip 140 is mounted, may be referred to as a package substrate.

The lower redistribution insulation layer 111 may include an upper surface 111U and a bottom surface 111L, which are opposite to each other. The upper surface 111U of the lower redistribution insulation layer 111 may face the first semiconductor chip 140 mounted on the lower redistribution structure 110. Hereinafter, a direction in parallel with the upper surface 111U of the lower redistribution insulation layer 111 may be defined as a horizontal direction (for example, an X direction and/or a Y direction), and a direction vertical to the upper surface 111U of the lower redistribution insulation layer 111 may be defined as a vertical direction (for example, a Z direction). In addition, a horizontal width of an arbitrary member may mean a length in the horizontal direction (for example, the X direction and/or the Y direction), and a vertical height (or, thickness) of an arbitrary member may mean a length in the vertical direction (for example, the Z direction).

The lower redistribution insulation layer 111 may include a plurality of insulation layers stacked in the vertical direction (for example, the Z direction). For example, the lower redistribution insulation layer 111 may include first through third insulation layers 1111, 1113, and 1115 stacked in the vertical direction (for example, the Z direction). The first insulation layer 1111 may be a lowermost insulation layer, and the third insulation layer 1115 may be an uppermost insulation layer. In FIG. 1, the lower redistribution insulation layer 111 is illustrated as including insulation layers having a three-layer structure, but the lower redistribution insulation layer 111 may also include insulation layers having a two-layer structure or insulation layers having a multilayer structure of four or more layers.

The lower redistribution insulation layer 111 may include a material layer including organic compound. For example, the lower redistribution insulation layer 111 may include any one of a photo imagable dielectric (PID) film, a photosensitive polyimide (PSPI) film, and a build-up film. In some example embodiments, a vertical height of the lower redistribution insulation layer 111 may be about 40 μm to about 100 μm. In some example embodiments, the lower redistribution insulation layer 111 may be formed from the PSPI.

In some example embodiments, a surface roughness of the bottom surface 111L of the lower redistribution insulation layer 111 may be greater than a surface roughness of the upper surface 111U of the lower redistribution insulation layer 111 and/or a surface roughness of one or more sidewalls 111S of the lower redistribution insulation layer 111, which at least partially define a cavity 112 of the lower redistribution insulation layer 111 to be described below. For example, the bottom surface 111L of the lower redistribution insulation layer 111 may have a relatively high surface roughness by using a laser process. In some example embodiments, a center line average surface roughness Ra of the bottom surface 111L of the lower redistribution insulation layer 111 may be between about 20 nm to about 200 nm.

The lower redistribution pattern 113 may include a plurality of lower redistribution line patterns 1131 extending along at least one of an upper surface and a lower surface of each of the first through third insulation layers 1111, 1113, and 1115, and a plurality of lower redistribution via patterns 1133 penetrating at least one of the first through third insulation layers 1111, 1113, and 1115. For example, as illustrated in FIG. 1, the plurality of lower redistribution line patterns 1131 may extend along an upper surface of at least one of the first through third insulation layers 1111, 1113, and 1115. The plurality of lower redistribution via patterns 1133 may electrically connect between the plurality of lower redistribution line patterns 1131, which are arranged at different levels from each other in the vertical direction (for example, a Z direction). The plurality of lower redistribution line patterns 1131 provided on the upper surface 111U of the lower redistribution insulation layer 111 among the plurality of lower redistribution line patterns 1131 may include pads respectively attached to chip connection bumps 151 and pads respectively attached to the conductive posts 163.

In the present specification, the term 'level' and/or 'height' may mean a vertical height and/or a distance from a reference location (e.g., the bottom surface 111L of the lower redistribution insulation layer 111) in a vertical direction (e.g., the Z direction). For example, when a first element is described herein to be at a higher level than a second element, the first element may be further from the reference location in the vertical direction than the second element. In another example, when a first element is described herein to be at a lower level than a second element, the first element may be closer to the reference location in the vertical direction than the second element. In another example, when a first element is described herein to be at a same level as a second element, the first element may be equally distant from/close to the reference location in the vertical direction as the second element.

At least some of the plurality of lower redistribution line patterns 1131 may form one body together with some of the plurality of lower redistribution via patterns 1133. For example, some of the plurality of lower redistribution line patterns 1131 may form one body together with the lower redistribution via patterns 1133, which contact lower side surfaces of the plurality of lower redistribution line patterns 1131. For example, the lower redistribution line pattern 1131 and the lower redistribution via pattern 1133 may be formed together with each other by using a damascene process. In this case, a seed metal layer may be arranged between each of the plurality of lower redistribution line pattern 1131 and the plurality of lower redistribution via pattern 1133, and the lower redistribution insulation layer 111. For example, the seed metal layer may include at least one of copper (Cu), titanium (Ti), titanium tungsten (TiW), Ti nitride (TiN), tantalum (Ta), Ta nitride (TaN), chromium (Cr), and aluminum (Al). For example, the seed metal layer may be formed by using a physical vapor deposition process such as a sputtering process.

In some example embodiments, each of the plurality of lower redistribution via patterns 1133 may have a tapered shape, in which a horizontal width decreases in a direction from an upper side thereof to a lower side thereof. In other words, the horizontal width of each of the plurality of lower redistribution via patterns 1133 may be gradually reduced toward the bottom surface 111L of the lower redistribution insulation layer 111.

The bump pad 115 may be provided in the lower redistribution insulation layer 111, and electrically and physically connected to an external connection bump 191. The bump pad 115 may include an under bump metal, to which the external connection bump 191 is attached. In some example embodiments, the bump pad 115 may have a uniform thickness, and both an upper surface 115U and a bottom surface 115L of the bump pad 115 may be flat surfaces. In some example embodiments, in a cross-sectional view of the semiconductor package 1000, the bump pad 115 may have a rectangular shape. The bump pad 115 may be provided on an upper surface of the first insulation layer 1111, and may overlap a pad opening 11110 of the first insulation layer 1111. The external connection bump 191 may fill the pad opening 11110 of the first insulation layer 1111, and contact the bottom surface 115L of the bump pad 115. The upper surface 115U of the bump pad 115 may contact the lower redistribution via pattern 1133. The bump pad 115 may be electrically connected to the lower redistribution line pattern 1131 via the lower redistribution via pattern 1133.

In some example embodiments, the bump pad 115 may include a metal layer having a multilayer structure. For example, the bump pad 115 may include a seed metal layer on the upper surface of the first insulation layer 1111, and a core metal layer stacked on the seed metal layer. The core metal layer may be formed by using a plating process using the seed metal layer as a seed.

For example, the lower redistribution pattern 113 and the bump pad 115 may include a metal such as Cu, Al, tungsten (W), Ti, Ta, indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof.

The external connection bump 191 may electrically and physically connect between the semiconductor package 1000 and an external device, on which the semiconductor package 1000 is mounted. An upper portion of the external connection bump 191 may fill the pad opening 11110 of the first insulation layer 1111, and a lower portion of the external connection bump 191 may protrude downwardly from the bottom surface 111L of the lower redistribution insulation layer 111. In addition, the external connection bump 191 may contact the bottom surface 111L of the lower redistribution insulation layer 111. As described above, because the bottom surface 111L of the lower redistribution insulation layer 111 may have a relatively large surface roughness, an adhesion force between the lower redistribution insulation layer 111 and the external connection bump 191 may be strengthened. The external connection bump 191 may include, for example, a solder ball or a solder bump.

In some example embodiments, a vertical height H1 of the external connection bump 191 measured from the bottom surface 111L of the lower redistribution insulation layer 111 may be equal to or less than about 180 μm. For example, the vertical height H1 of the external connection bump 191 measured from the bottom surface 111L of the lower redistribution insulation layer 111 may be about 50 μm to about 180 μm, or about 80 μm to about 120 μm.

The passive component 121 may be provided in the lower redistribution insulation layer 111. The lower redistribution insulation layer 111 may include the cavity 112 penetrating the lower redistribution insulation layer 111 in the vertical direction (for example, a Z direction). For example, as shown in at least FIGS. 1-2, the lower redistribution insulation layer 111 may include one or more sidewalls 111S that at least partially define the cavity 112 extending from a bottom surface 111L of the lower redistribution insulation layer 111 to an upper surface 111U of the lower redistribution insulation layer 111 (e.g., extending through a thickness of the lower redistribution insulation layer 111 in the vertical direction, for example, a Z direction), and the passive component 121 may be accommodated in the cavity 112 of the lower redistribution insulation layer 111. For example, the passive component 121 may include a surface-mount device (SMD). For example, the passive component 121 may include a capacitor or a resistor. A connection terminal of the passive component 121 may be provided on an upper surface of the passive component 121 facing the first semiconductor chip 140, and on the connection terminal of the passive component 121. A conductive connection pillar 125 for an electrical connection between the passive component 121 and the first semiconductor chip 140 may be attached on the connection terminal of the passive component 121. For example, the conductive connection pillar 125 may include a conductive material such as Cu and Al.

An adhesive film 123 may be attached on a bottom surface 121L of the passive component 121. The adhesive film 123 may cover the bottom surface 121L of the passive component 121 so that the bottom surface 121L of the passive component 121 is not exposed to the outside (e.g., the exterior of the semiconductor package 1000). For example, the adhesive film 123 may cover the bottom surface 121L of the passive component 121 so that the bottom surface 121L of the passive component 121 is isolated from exposure to the exterior of the semiconductor package 1000 by at least the adhesive film 123. Side portions of the adhesive film 123 may contact an insulation filler 130. For example, the adhesive film 123 may be formed from an insulating adhesive material. In some example embodiments, the adhesive film 123 may include a die attach film. A surface of the adhesive film 123 may be generally at the same level as the bottom surface 111L of the lower redistribution insulation layer 111, and may be exposed to the outside of the semiconductor package 1000 through the bottom surface 111L of the lower redistribution insulation layer 111.

The insulation filler 130 may fill the cavity 112 of the lower redistribution insulation layer 111, and cover sidewalls of the passive component 121. The insulation filler 130 may fill a space between a sidewall 111S of the lower redistribution insulation layer 111 and a sidewall of the passive component 121, which defines the cavity 112 of the lower redistribution insulation layer 111. The insulation filler 130 may include a bottom surface 130L arranged generally at the same vertical level as the bottom surface 111L of the lower redistribution insulation layer 111. The bottom surface 130L of the insulation filler 130 may be exposed to the outside of the semiconductor package 1000 (e.g., the exterior of the semiconductor package 1000) through the bottom surface 111L of the lower redistribution insulation layer 111. In addition, the insulation filler 130 may cover the upper surface 111U of the lower redistribution insulation layer 111 and the upper surface of the passive component 121, and may cover sidewalls of the conductive connection pillar 125 attached to the passive component 121. In some example embodiments, the insulation filler 130 and the conductive connection pillar 125 may include planarized upper surfaces by using a planarization process, and the upper surface of the insulation filler 130 may be coplanar with the upper surface of the conductive connection pillar 125.

In some example embodiments, a surface roughness of the bottom surface 130L of the insulation filler 130 may be different from a surface roughness of the bottom surface 111L of the lower redistribution insulation layer 111. In some example embodiments, the surface roughness of the bottom surface 130L of the insulation filler 130 may be less than the surface roughness of the bottom surface 111L of the lower redistribution insulation layer 111. Accordingly, at an interface of the bottom surface 130L of the insulation filler 130 and the bottom surface 111L of the lower redistribution insulation layer 111, surfaces having different surface roughness from each other may meet each other. For example, while the bottom surface 111L of the lower redistribution insulation layer 111 is laser-processed, by blocking exposure of a laser beam on the bottom surface 130L of the insulation filler 130, the surface roughness of the bottom surface 130L of the insulation filler 130 may be less than the surface roughness of the bottom surface 111L of the lower redistribution insulation layer 111. The surface roughness of the bottom surface 111L of the lower redistribution insulation layer 111 may be greater than both the surface roughness of the bottom surface 130L of the insulation filler 130 and the surface roughness of the upper surface 111U of the lower redistribution insulation layer 111.

In some example embodiments, the bottom surface 130L of the insulation filler 130 and/or an exposed surface (e.g., exposed to an exterior of the semiconductor package 1000) of the adhesive film 123 may have a surface roughness at a level equal or similar to the surface roughness of the bottom surface 111L of the lower redistribution insulation layer 111. For example, when the bottom surface 111L of the lower redistribution insulation layer 111 is laser-processed, the bottom surface 130L of the insulation filler 130 and/or the exposed surface of the adhesive film 123 may be laser-processed together, the bottom surface 130L of the insulation filler 130 and/or the exposed surface of the adhesive film 123 may be formed to have a surface roughness at a level equal or similar to the surface roughness of the bottom surface 111L of the lower redistribution insulation layer 111.

In some example embodiments, the insulation filler 130 may include thermosetting resin such as epoxy resin, thermoplastic resin such as polyimide, or resin, in which a reinforcement material such as an inorganic filler is included in the thermosetting resin or thermoplastic resin. For example, the insulation filler 130 may include a build-up film such as an Ajinomoto build-up film (ABF). In some example embodiments, the insulation filler 130 and the lower redistribution insulation layer 111 may include different materials or different material combinations from each other. In addition, the insulation filler 130 and the molding layer 161 may include different materials or different material combinations from each other. In some example embodiments, the insulation filler 130 may be formed from epoxy resin, and the molding layer 161 may be formed from epoxy mold compound (EMC).

The first semiconductor chip 140 may be mounted on the lower redistribution structure 110. The first semiconductor chip 140 may include a semiconductor substrate 141, a first chip pad 143 electrically connected to the lower redistribution pattern 113, and a second chip pad 145 electrically connected to the passive component 121. The first semiconductor chip 140 may thus be electrically connected to both the lower redistribution pattern 113 and the passive component 121. The first semiconductor chip 140 may be mounted on the lower redistribution structure 110 by using a face-down method. A bottom surface of the first semiconductor chip 140 including the first chip pad 143 and the second chip pad 145 may face the upper surface 111U of the lower redistribution insulation layer 111. In some example embodiments, a horizontal width of the first chip pad 143 may be greater than a horizontal width of the second chip pad 145.

The semiconductor substrate 141 may include an active surface and an inactive surface, which are opposite to each other. In FIG. 1, the active surface of the semiconductor substrate 141 may be a surface adjacent to the bottom surface of the first semiconductor chip 140, and the inactive surface of the semiconductor substrate 141 may be a surface adjacent to an upper surface of the first semiconductor chip 140. The semiconductor substrate 141 may include silicon, for example, crystalline silicon, polycrystalline silicon, or amorphous silicon. The first semiconductor chip 140 may include a semiconductor element layer formed on the active surface thereof. The first chip pad 143 and the second chip pad 145 of the first semiconductor chip 140 may be electrically connected to the semiconductor element layer via a wiring structure provided in the first semiconductor chip 140. The first chip pad 143 of the first semiconductor chip 140 may be electrically connected to the external connection bump 191 and/or the conductive post 163 via the chip connection bump 151 and the lower redistribution pattern 113. The first chip pad 143 of the first semiconductor chip 140 may be used as a terminal for input/output data signal transmission of the first semiconductor chip 140, or a terminal for power and/or ground of the first semiconductor chip 140. The second chip pad 145 of the first semiconductor chip 140 may be electrically connected to a connection pad 121P of the passive component 121 via a component connection bump 153, which is provided between the first semiconductor chip 140 and the conductive connection pillar 125.

In some example embodiments, the first semiconductor chip 140 may include, as a memory chip, a volatile memory chip and/or a non-volatile memory chip. The volatile memory chip may include, for example, dynamic random access memory (RAM) (DRAM), static RAM (SRAM), thyristor RAM (TRAM), zero capacitor RAM (ZRAM), or twin transistor RAM (TTRAM). In addition, the non-volatile memory chip may include, for example, flash memory, magnetic RAM (MRAM), spin-transfer-torque MRAM (STT-MRAM), ferroelectric RAM (FRAM), phase change RAM (PRAM), nanotube RRAM, polymer RAM, or an insulator resistance change memory, etc.

In some example embodiments, the first semiconductor chip 140 may include a logic chip. The logic chip may include, for example, an artificial intelligence semiconductor, a microprocessor, a graphics processor, a signal processor, a network processor, a chipset, an audio codec, a video codec, and an application processor.

The molding layer 161 may be arranged on the lower redistribution structure 110, and cover at least a portion of the first semiconductor chip 140. The molding layer 161 may cover sidewalls and an upper surface of the first semiconductor chip 140, and cover an upper surface of the insulation filler 130. In addition, the molding layer 161 may be formed to fill a space between the first semiconductor chip 140 and the upper surface of the insulation filler 130 by using a molded underfill process, and may cover sidewalls of the chip connection bump 151 and sidewalls of the component connection bump 153. For example, the molding layer 161 may include EMC and/or a photosensitive material such as photoimageable encapsulant (PIE).

The conductive post 163 may be spaced apart from the sidewalls of the first semiconductor chip 140 in a lateral direction. The conductive post 163 may have a pillar shape penetrating the molding layer 161 in the vertical direction (for example, a Z direction). In some example embodiments, each of the conductive post 163 and the molding layer 161 may include a planarized upper surface by using a planarization process, and an upper surface of the conductive post 163 may be coplanar with an upper surface of the molding layer 161. A lower surface of the conductive post 163 may contact the lower redistribution pattern 113 on the upper surface 111U of the lower redistribution insulation layer 111, and an upper surface of the conductive post 163 may contact the upper redistribution structure 170. The conductive post 163 may electrically connect between the lower redistribution pattern 113 of the lower redistribution structure 110 and an upper redistribution pattern 173 of the upper redistribution structure 170. For example, the conductive post 163 may include Cu.

The upper redistribution structure 170 may be provided on the upper surface of the molding layer 161. A footprint of the upper redistribution structure 170 may be the same as the footprint of the semiconductor package 1000. The upper redistribution structure 170 may include an upper redistribution insulation layer 171 and the upper redistribution pattern 173.

The upper redistribution insulation layer 171 may include a plurality of insulation layers stacked in the vertical direction (for example, a Z direction). For example, the upper redistribution insulation layer 171 may include fourth through sixth insulation layers 1711, 1713, and 1715 stacked in the vertical direction (for example, a Z direction). The fourth insulation layer 1711 may be a lowermost insulation layer contacting the upper surface of the molding layer 161, and the sixth insulation layer 1715 may be an uppermost insulation layer. In FIG. 1, the upper redistribution insulation layer 171 is illustrated as including insulation layers having a three-layer structure, but the upper redistribution insulation layer 171 may also include insulation layers having a two-layer structure or insulation layers having a multilayer structure of four or more layers. A material constituting the upper redistribution insulation layer 171 may include the same material as the lower redistribution insulation layer 111. In some example embodiments, the upper redistribution insulation layer 171 may be formed from the PSPI.

The upper redistribution pattern 173 may include a plurality of upper redistribution line patterns 1731 extending along at least one of an upper surface and a lower surface of each of the fourth through sixth insulation layers 1711, 1713, and 1715, and a plurality of upper redistribution via patterns 1733 penetrating at least one of the fourth through sixth insulation layers 1711, 1713, and 1715 and extending. For example, as illustrated in FIG. 1, the plurality of upper redistribution line patterns 1731 may extend along an upper surface of at least one of the fourth through sixth insulation layers 1711, 1713, and 1715. The plurality of upper redistribution via patterns 1733 may electrically connect between the plurality of upper redistribution line patterns 1731, which are arranged at different levels from each other in the vertical direction (for example, a Z direction). In addition, the upper redistribution via pattern 1733 penetrating the fourth insulation layer 1711 may be connected to the conductive post 163, and may electrically connect between the conductive post 163 and the plurality of upper redistribution line patterns 1731 contacting an upper surface of the fourth insulation layer 1711.

In some example embodiments, each of the plurality of upper redistribution via patterns 1733 may have a tapered shape, in which a horizontal width decreases in a direction from an upper side thereof to a lower side thereof. In other words, the horizontal width of each of the plurality of upper redistribution via patterns 1733 may gradually decrease toward the upper surface of the molding layer 161 or the upper surface of the conductive post 163. A material, a structure, and a forming method of the upper redistribution pattern 173 may be substantially the same as a material, a structure, and a forming method of the lower redistribution pattern 113.

In a general semiconductor package, a passive component may be attached to a bottom surface of a package substrate. In this case, because a solder ball attached to the bottom surface of the package substrate is required to have a greater height than the passive component, a total height of the semiconductor package may become large, and it may be difficult to miniaturize the semiconductor package.

However, according to some example embodiments of the inventive concepts, because the passive component 121 is buried in the lower redistribution structure 110, a height of the external connection bump 191 may be reduced, and thus, miniaturization of the semiconductor package 1000 may be implemented.

Figure 3:
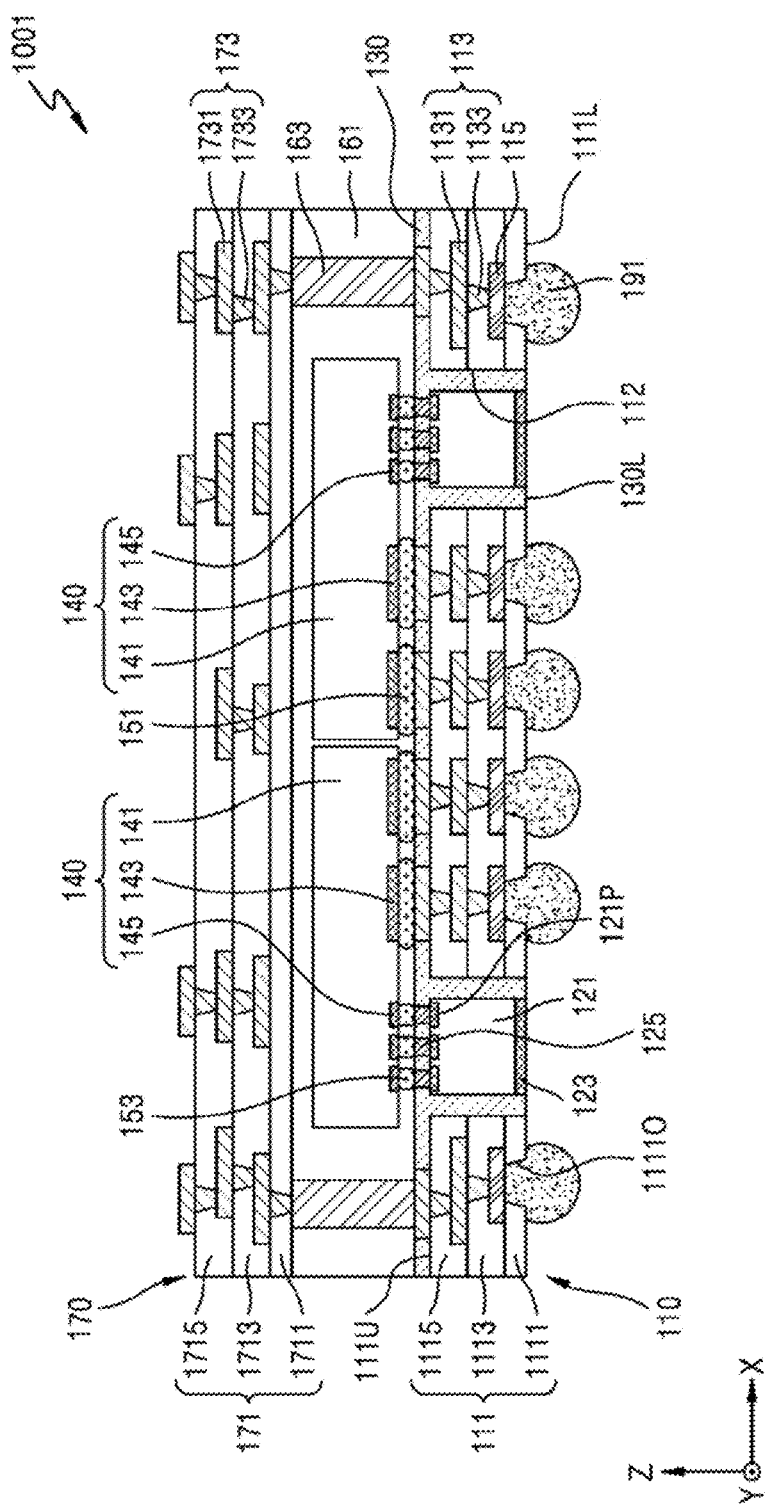
FIG. 3 is a cross-sectional view of a semiconductor package according to some example embodiments.

FIG. 3 is a cross-sectional view of a semiconductor package 1001 according to some example embodiments. Below, descriptions of the semiconductor package 1001 illustrated in FIG. 3 are provided, mainly based on differences from the semiconductor package 1000 described with reference to FIGS. 1 and 2.

Referring to FIG. 3, the semiconductor package 1001 may include a plurality of first semiconductor chips 140 mounted on the lower redistribution structure 110. The plurality of first semiconductor chips 140 may be arranged side-by-side on the lower redistribution structure 110. Each of the plurality of first semiconductor chips 140 may be electrically connected to the lower redistribution pattern 113 via the chip connection bump 151, and may be electrically connected to the passive component 121 via the component connection bump 153. In addition, the plurality of first semiconductor chips 140 may be electrically connected to each other via the lower redistribution pattern 113.

In some example embodiments, the plurality of first semiconductor chips 140 may include homogeneous semiconductor chips. For example, all of the plurality of first semiconductor chips 140 may include memory chips or logic chips.

In some example embodiments, the plurality of first semiconductor chips 140 may include heterogeneous semiconductor chips. For example, any one among the plurality of first semiconductor chips 140 may include a memory chip, and any one among the plurality of first semiconductor chips 140 may include a logic chip.

Figure 4:
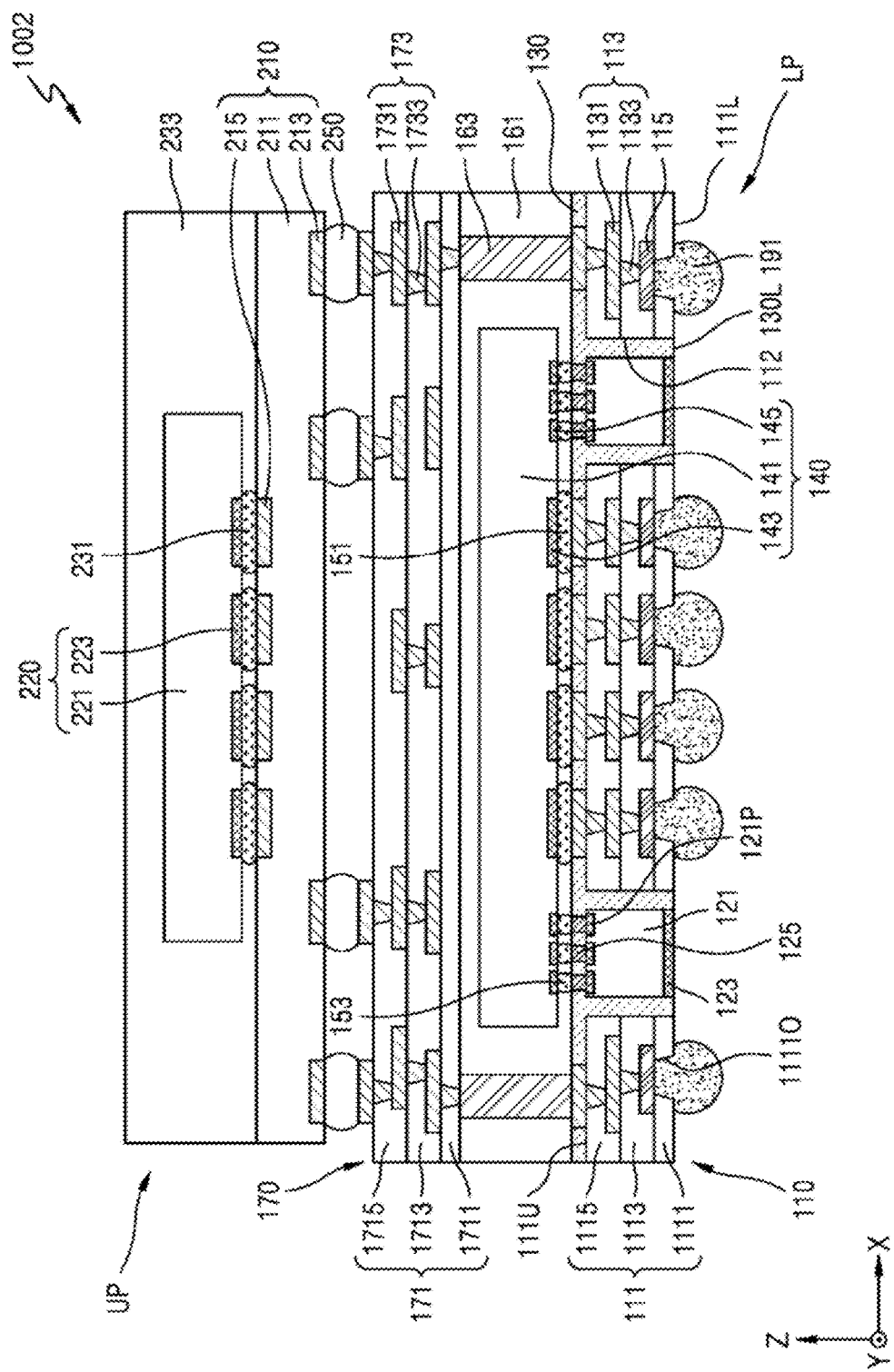
FIG. 4 is a cross-sectional view of a semiconductor package according to some example embodiments.

FIG. 4 is a cross-sectional view of a semiconductor package 1002 according to some example embodiments.

Referring to FIG. 4 together with FIG. 1, the semiconductor package 1002 may include a lower package LP and an upper package UP. The semiconductor package 1002 may include a semiconductor package of a package-on-package type, in which the upper package UP is stacked on the lower package LP of a fan out semiconductor package type.

In FIG. 4, the lower package LP is illustrated as corresponding to the semiconductor package 1000 described with reference to FIG. 1 before, but the lower package LP may also correspond to the semiconductor package 1001 described with reference to FIG. 3.

The upper package UP may include a package substrate 210, a second semiconductor chip 220, and an upper molding layer 233.

The package substrate 210 may include, for example, a printed circuit board. The package substrate 210 may include a base layer 211, a lower conductive layer 213 provided in a lower surface of the base layer 211, and an upper conductive layer 215 provided in an upper surface of the base layer 211. The lower conductive layer 213 and the upper conductive layer 215 may be electrically connected to each other via an internal wiring provided in the package substrate 210.

An inter-package connection terminal 250 may be arranged between the package substrate 210 of the upper package UP and the upper redistribution structure 170 of the lower package LP. The package substrate 210 may be stacked over the upper redistribution structure 170 via the inter-package connection terminal 250. An upper portion of the inter-package connection terminal 250 may be connected to the lower conductive layer 213 of the package substrate 210. A lower portion of the inter-package connection terminal 250 may be connected to the upper redistribution pattern 173 provided on an upper surface of the upper redistribution insulation layer 171. For example, the inter-package connection terminal 250 may include a solder.

The second semiconductor chip 220 may be arranged on the package substrate 210. The second semiconductor chip 220 may include a semiconductor substrate 221 and a chip pad 223. For example, the chip pad 223 of the second semiconductor chip 220 may be electrically connected to the upper conductive layer 215 of the package substrate 210 via an upper chip connection bump 231. The second semiconductor chip 220 may be electrically connected to the first semiconductor chip 140 via an electrical path passing through the package substrate 210, the upper redistribution pattern 173, the conductive post 163, the lower redistribution pattern 113, and the chip connection bump 151. In addition, the second semiconductor chip 220 may be electrically connected to the external connection bump 191 via an electrical path passing through the package substrate 210, the upper redistribution pattern 173, the conductive post 163, and the lower redistribution pattern 113. In some example embodiments, the second semiconductor chip 220 may include a memory semiconductor chip. In some example embodiments, the second semiconductor chip 220 may include a logic semiconductor chip. In some example embodiments, any one of the first semiconductor chip 140 and the second semiconductor chip 220 may include a logic chip, and the other may include a memory chip.

The upper molding layer 233 may be arranged on the package substrate 210 to cover at least a portion of the second semiconductor chip 220. The upper molding layer 233 may include, for example, epoxy-based molding resin, polyimide-based molding resin, etc. For example, the upper molding layer 233 may include EMC.

FIGS. 5A, 5B, 5C, 5D, 5E, 5F, 5G, 5H, 5I, 5J, 5K, 5L, 5M, 5N, and 5O are cross-sectional views illustrating a method of manufacturing a semiconductor package, according to some example embodiments. Below, a method of fabricating the semiconductor package 1000 illustrated in FIG. 1 is described, with reference to FIGS. 5A through 5O.

Figure 5A:
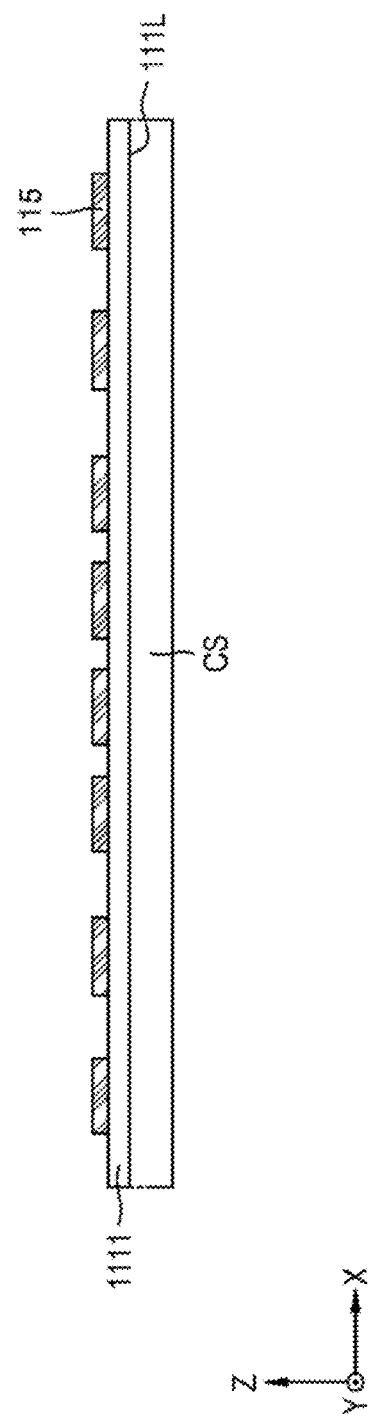

Referring to FIG. 5A, a carrier substrate CS may be prepared. For example, the carrier substrate CS may include a material capable of transmitting a laser beam. The carrier substrate CS may include a light-transmitting material, for example, glass.

Next, the first insulation layer 1111 may be formed on the prepared carrier substrate CS. For example, the first insulation layer 1111 may be formed by laminating a PSPI film on the carrier substrate CS. After the first insulation layer 1111 is formed, the bump pad 115 may be formed on the first insulation layer 1111. To form the bump pad 115, an operation of forming a seed metal layer on the first insulation layer 1111 and an operation of forming a core metal layer on the seed metal layer by using an electroplating process using the seed metal layer may be sequentially performed.

Figure 5B:
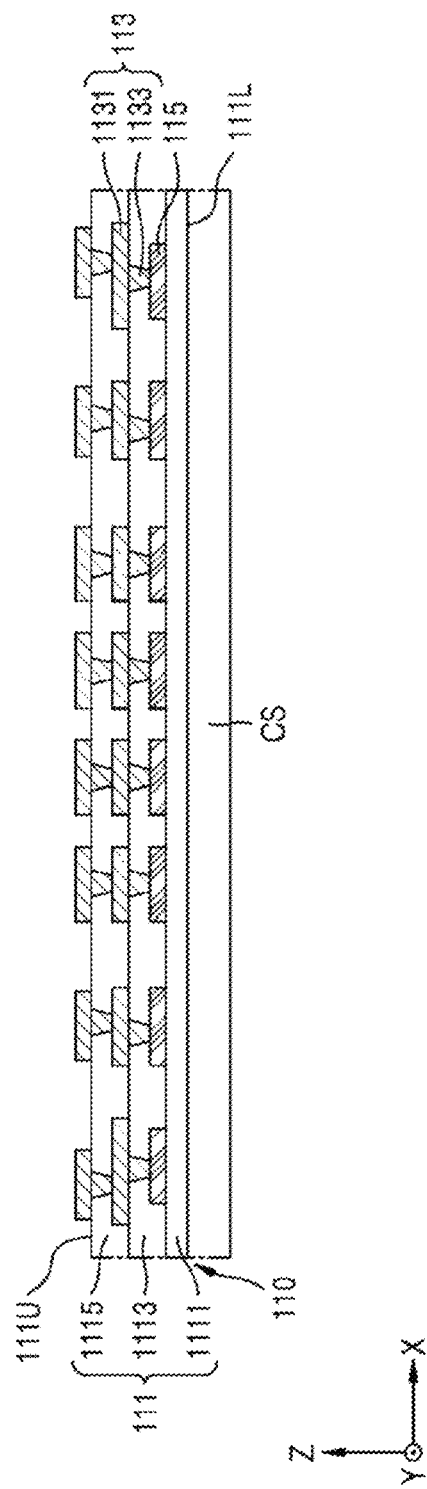

Referring to FIG. 5B, after the bump pad 115 is formed, the second insulation layer 1113, the third insulation layer 1115, and the lower redistribution pattern 113 may be formed. For example, an operation of forming the second insulation layer 1113 by laminating a PSPI film on the first insulation layer 1111, an operation of forming an opening in the second insulation layer 1113 to expose the bump pad 115, an operation of performing a metallization process to form the lower redistribution via pattern 1133 filling the opening of the second insulation layer 1113 and the lower redistribution line pattern 1131 extended along the upper surface of the second insulation layer 1113, an operation of forming the third insulation layer 1115 by laminating the PSPI film on the second insulation layer 1113, an operation of forming an opening in the third insulation layer 1115 to expose the lower redistribution line pattern 1131 extended along the upper surface of the second insulation layer 1113, and an operation of performing a metallization process to form the lower redistribution via pattern 1133 filling the opening of the third insulation layer 1115 and the lower redistribution line pattern 1131 extended along the upper surface of the third insulation layer 1115 may be sequentially performed. The first through third insulation layers 1111, 1113, and 1115, the bump pad 115, and the lower redistribution pattern 113 may constitute the lower redistribution structure 110.

After the lower redistribution structure 110 is formed, the cavity 112, into which the passive component 121 is inserted, may be formed in the lower redistribution structure 110. To form the cavity 112 in the lower redistribution structure 110, an operation of forming a cutting region CL defining a removal structure RS in the lower redistribution structure 110, an operation of attaching a debonding film DF on the lower redistribution structure 110, an operation of irradiating a laser beam, through the carrier substrate CS, to an interface between the removal structure RS and the carrier substrate CS, and an operation of separating the debonding film DF and the removal structure RS attached to the debonding film DF from the lower redistribution structure 110 may be sequentially performed. Below, referring to FIGS. 5C through 5F, an operation of forming the cavity 112 in the lower redistribution structure 110 is described in detail.

Figure 5C:
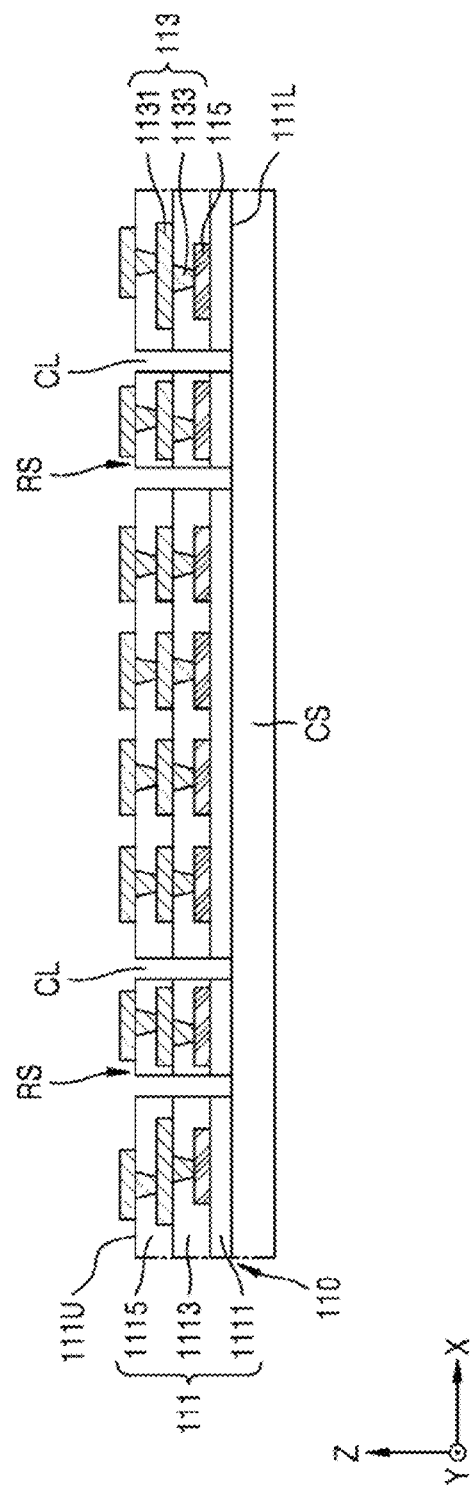

Referring to FIG. 5C, after the lower redistribution structure 110 is formed, a portion of the lower redistribution structure 110 may be removed to form the cutting region CL, which defines the removal structure RS in the lower redistribution structure 110. The cutting region CL may penetrate the lower redistribution structure 110 in the vertical direction (for example, a Z direction), and in a plan view, may have a ring shape, which is continuously extended along a periphery of the removal structure RS. For example, to form the cutting region CL, a portion of the lower redistribution structure 110 may be removed by using at least one of a laser drilling process, a machining process, and an etching process.

For example, when the cutting region CL is formed by using a laser drilling process, the laser beam used in the laser drilling process may have a wavelength in a range of about 343 nm to about 355 nm, and an ultra-pulse width equal to or less than a nano second (for example, an ultra-pulse width between about 400 femtoseconds (fs) and about 100 nanoseconds (ns)).

Figure 5D:
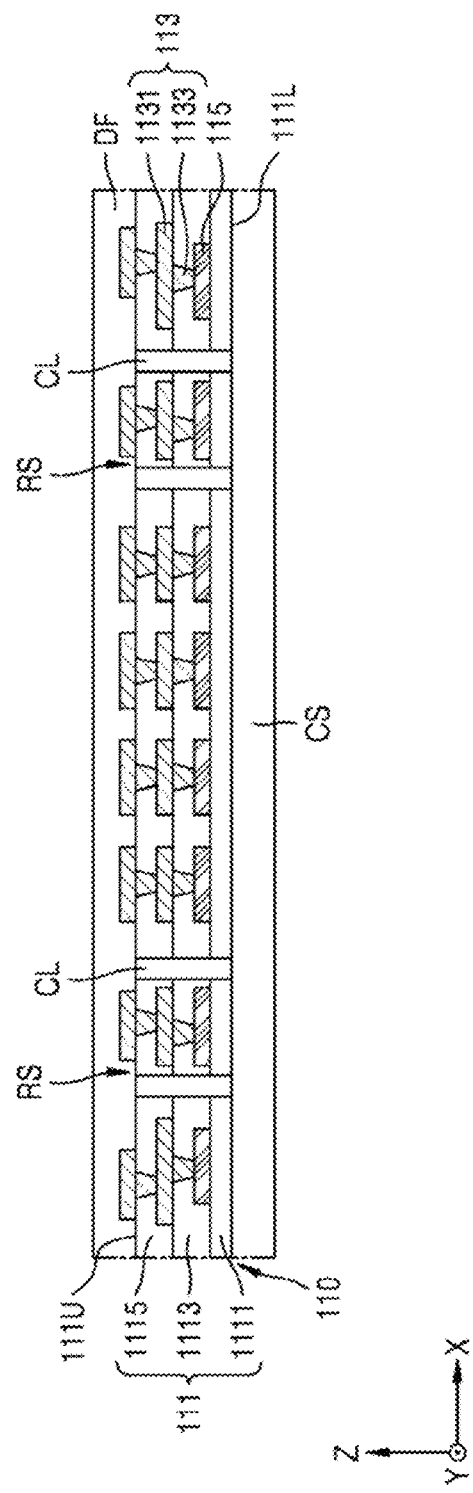

Referring to FIG. 5D, after the cutting region CL is formed, the debonding film DF may be attached on the lower redistribution structure 110. The debonding film DF may be attached on the upper surface 111U of the lower redistribution insulation layer 111. In this case, an adhesion force between the debonding film DF and the lower redistribution structure 110 may be less than an adhesion force between the bottom surface 111L of the lower redistribution insulation layer 111 and the carrier substrate CS.

Figure 5E:
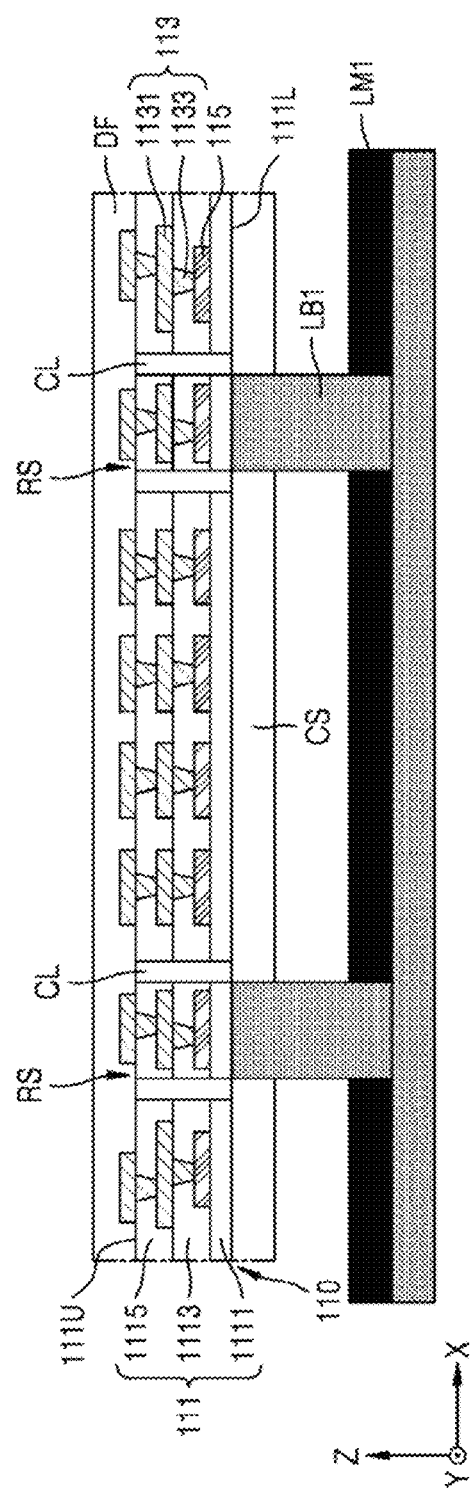

Referring to FIG. 5E, a first laser beam LB1 may be irradiated, through the carrier substrate CS, on an interface between the removal structure RS and the carrier substrate CS. The first laser beam LB1 may be irradiated on the interface between the removal structure RS and the carrier substrate CS, but may not be irradiated on the interface between the lower redistribution structure 110, except for the removal structure RS, and the carrier substrate CS. For example, the first laser beam LB1 may be selectively provided on local areas of the carrier substrate CS, by using a first beam mask LM1 configured to selectively transmit the first laser beam LB1. Openings of the first beam mask LM1 may be aligned with an interface between the removal structure RS and the carrier substrate CS in a proceeding direction of the first laser beam LB1. The first beam mask LM1 may include a metal or invar, which has a characteristic of not reacting to the first laser beam LB1 or a characteristic of having very small reactivity against the first laser beam LB1. When the first laser beam LB1 is irradiated on an interface between the removal structure RS and the carrier substrate CS, an adhesion force between the removal structure RS and the carrier substrate CS may be reduced. The adhesion force between the removal structure RS and the carrier substrate CS, on which the first laser beam LB1 is irradiated, may become less than an adhesion force between the removal structure RS and the debonding film DF. For example, the first laser beam LB1 used for reducing the adhesion force between the removal structure RS and the carrier substrate CS may be in an ultraviolet ray wavelength band.

Figure 5F:
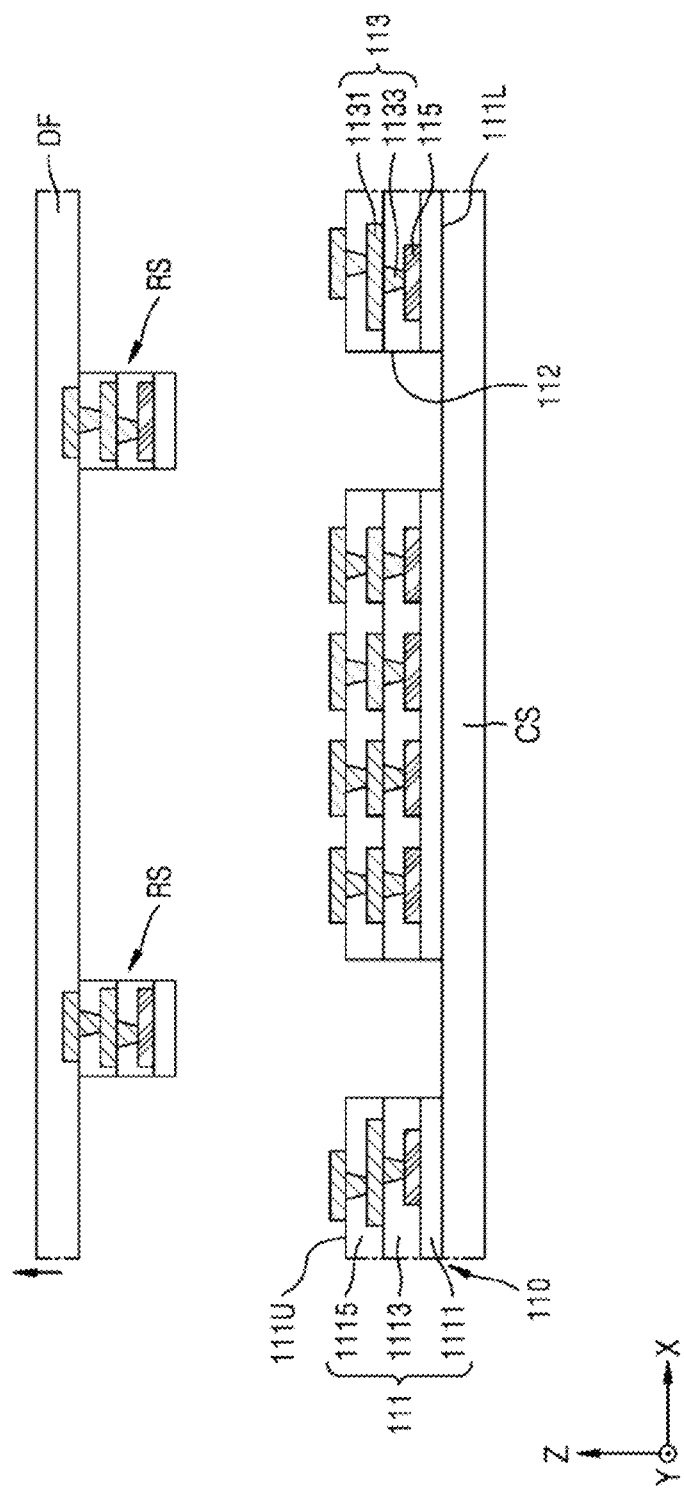

Referring to FIG. 5F, the debonding film DF may be separated from the lower redistribution structure 110. Because the adhesion force between the removal structure RS and the carrier substrate CS is less than the adhesion force between the removal structure RS and the debonding film DF, the removal structure RS attached to the debonding film DF may be removed from the lower redistribution structure 110 together with the debonding film DF. As the removal structure RS is removed, the cavity 112 penetrating the lower redistribution insulation layer 111 may be formed.

Figure 5G:
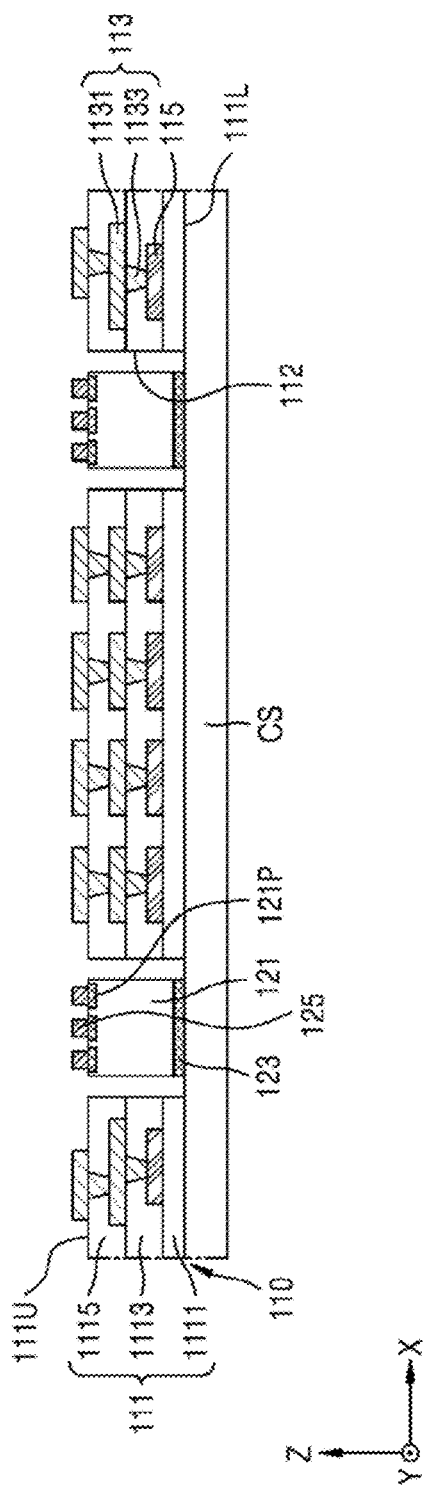

Referring to FIG. 5G, after the cavity 112 is formed in the lower redistribution structure 110, the passive component 121 may be inserted into the cavity 112 of the lower redistribution structure 110. The adhesive film 123 for fixing the passive component 121 on the carrier substrate CS may be arranged between a bottom surface of the passive component 121 and the carrier substrate CS. When the passive component 121 is inserted into the cavity 112 of the lower redistribution structure 110, the conductive connection pillar 125 connected to the connection pad 121P of the passive component 121 may be formed.

Figure 5H:
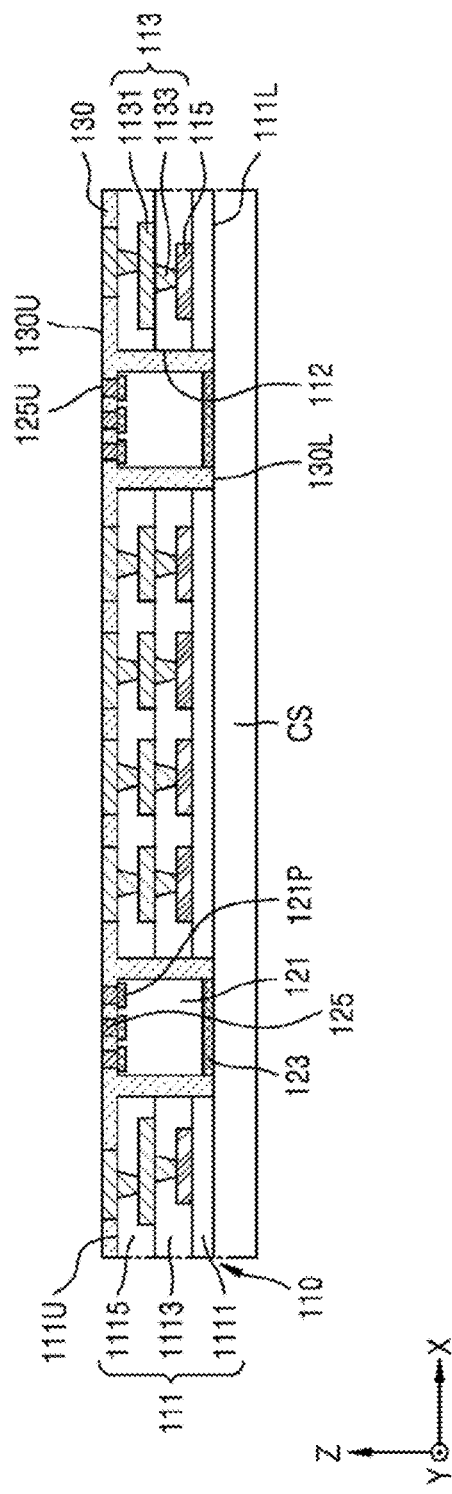

Referring to FIG. 5H, after the passive component 121 is inserted into the cavity 112 of the lower redistribution structure 110, the insulation filler 130 may be formed. The insulation filler 130 may fill the cavity 112 of the lower redistribution structure 110, and cover the upper surface 111U of the lower redistribution insulation layer 111 and the passive component 121. In addition, the insulation filler 130 may cover sidewalls of the conductive connection pillar 125, but may be formed to expose an upper surface 125U of the conductive connection pillar 125.

For example, to form the insulation filler 130, an operation of forming an encapsulation material covering the lower redistribution structure 110, the passive component 121, and the conductive connection pillar 125, and an operation of grinding a portion of the encapsulation material, so that the conductive connection pillar 125 and the lower redistribution pattern 113 provided on the upper surface 111U of the lower redistribution insulation layer 111 are exposed, may be sequentially performed. The operation of grinding may include a planarization process like a chemical mechanical polishing (CMP) process. A planarized upper surface 130U of the insulation filler 130, a planarized upper surface 125U of the conductive connection pillar 125, and a planarized upper surface of the lower redistribution pattern 113 may be coplanar.

Figure 5I:
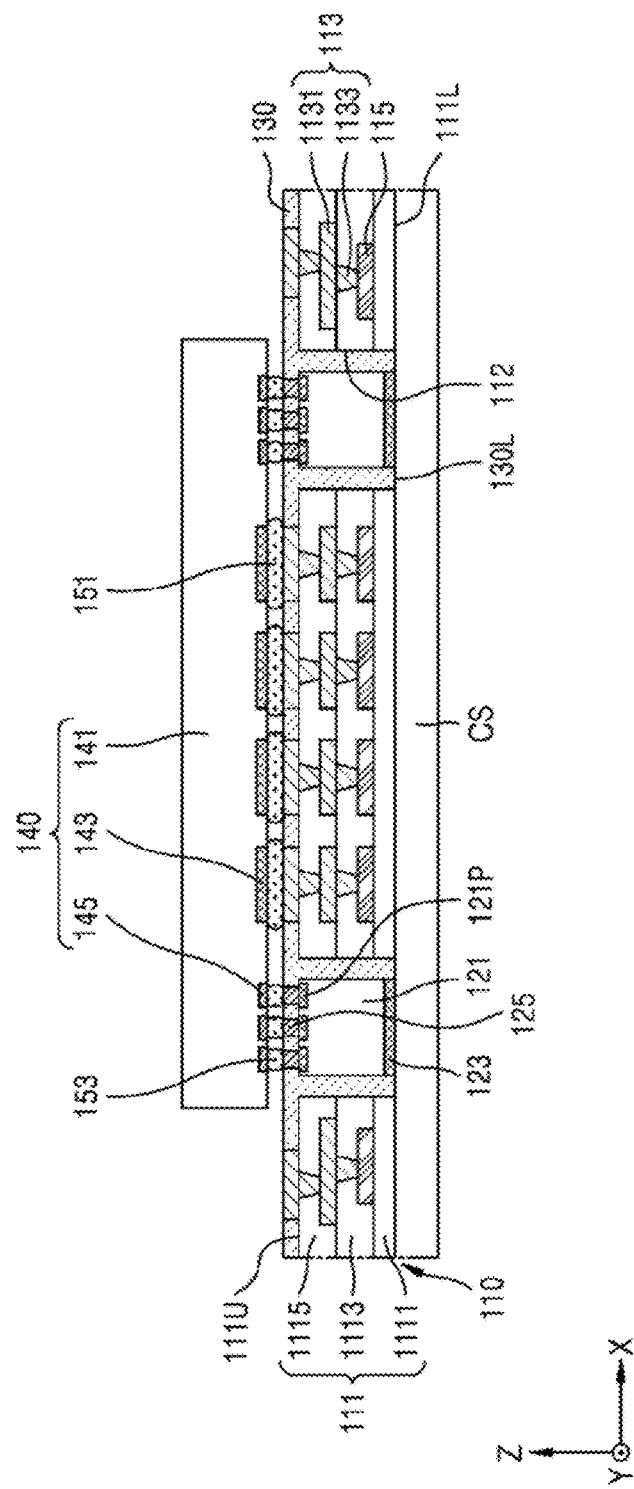

Referring to FIG. 5I, the first semiconductor chip 140 may be mounted on the lower redistribution structure 110. For example, the first semiconductor chip 140 may be mounted on the lower redistribution structure 110 so that a bottom surface of the first semiconductor chip 140, on which the first chip pad 143 and the second chip pad 145 are provided, faces the lower redistribution structure 110. The chip connection bump 151 may be arranged between the first semiconductor chip 140 and the lower redistribution structure 110, and the component connection bump 153 may be arranged between the first semiconductor chip 140 and the conductive connection pillar 125.

Figure 5J:
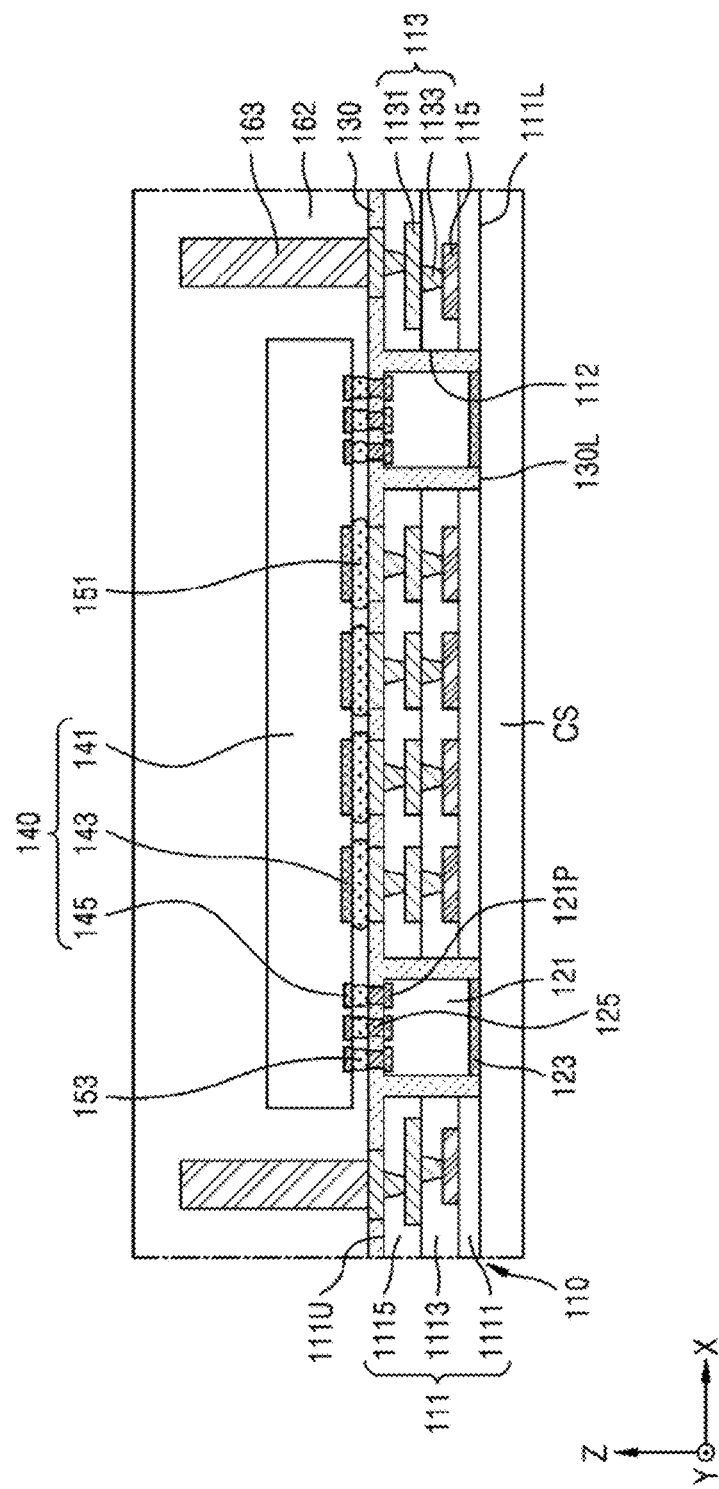

Referring to FIG. 5J, after the first semiconductor chip 140 is mounted (e.g., subsequently to the first semiconductor chip 140 being mounted), the conductive post 163 connected to the lower redistribution pattern 113 provided on the upper surface 111U of the lower redistribution insulation layer 111 may be formed, and thereafter, a preliminary molding layer 162 covering the first semiconductor chip 140 and the conductive post 163 may be formed on the lower redistribution structure 110.

Figure 5K:
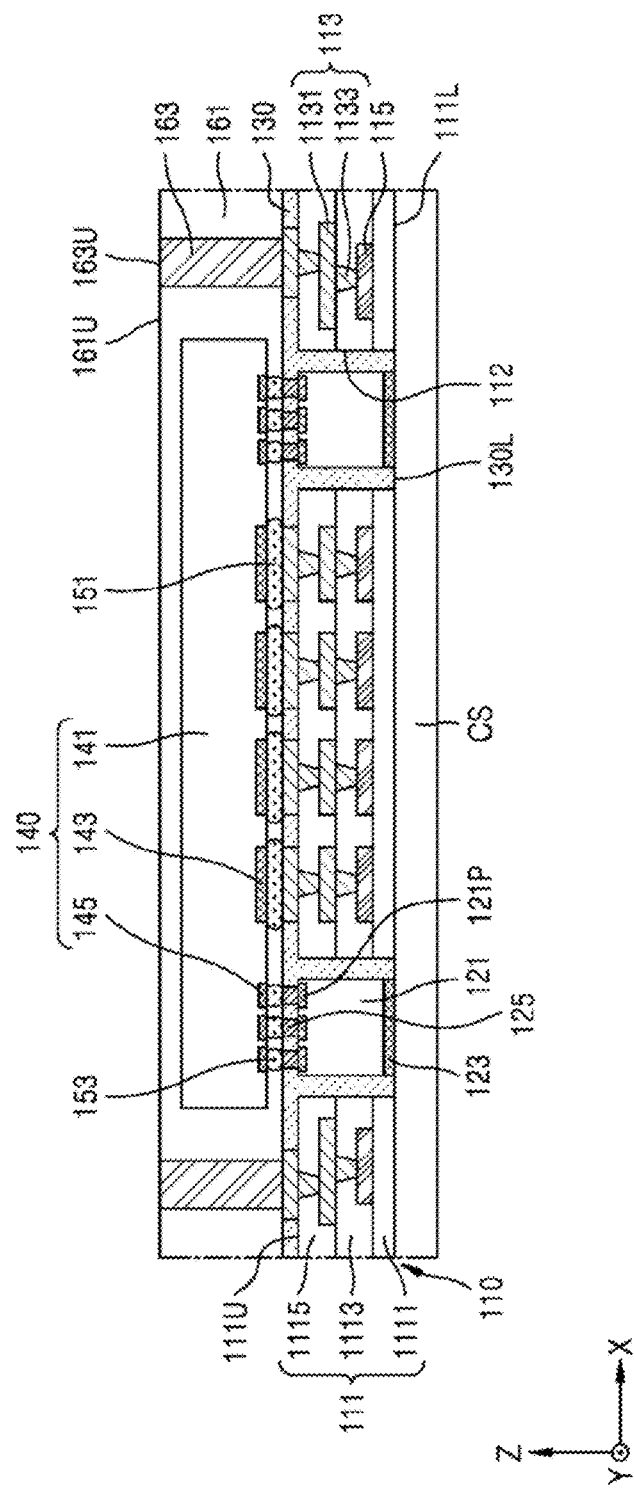

Referring to FIGS. 5J and 5K, after the conductive post 163 and the preliminary molding layer 162 are formed, a grinding process of removing a portion of the preliminary molding layer 162 may be performed so that the conductive post 163 is exposed. A portion of the preliminary molding layer 162 and a portion of the conductive post 163 may be removed by using the grinding process. The other portion of the preliminary molding layer 162, which remains after the grinding process, may constitute the molding layer 161. The grinding process may include a planarization process such as CMP. A planarized upper surface 161U of the molding layer 161 may be coplanar with a planarized upper surface 163U of the conductive post 163.

Figure 5L:
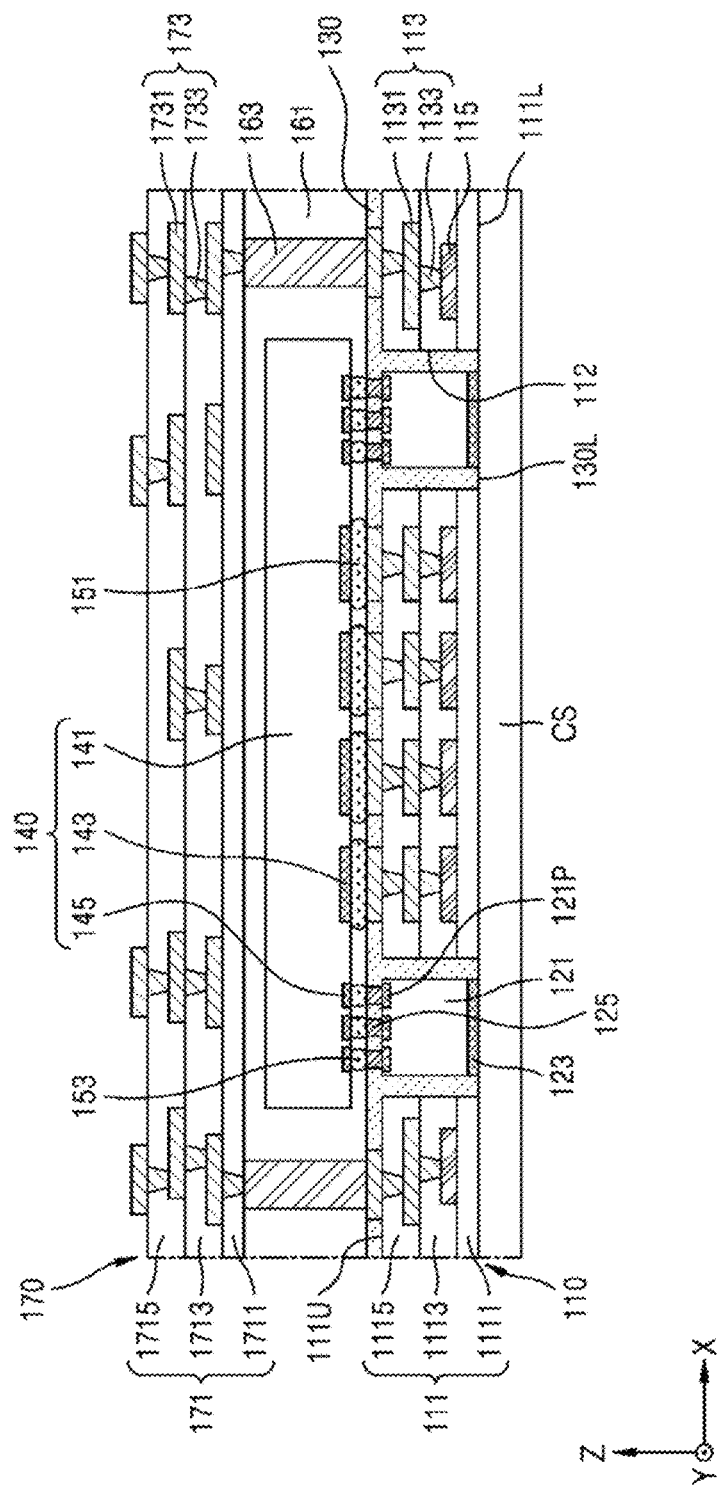

Referring to FIG. 5L, the upper redistribution structure 170 may be formed on the molding layer 161. The upper redistribution structure 170 may include the upper redistribution insulation layer 171 including the fourth through sixth insulation layers 1711, 1713, and 1715, and the upper redistribution pattern 173 covered by the upper redistribution insulation layer 171. The upper redistribution insulation layer 171 may be formed by using a method substantially equal or similar to a method described above for the lower redistribution insulation layer 111, and the upper redistribution pattern 173 may be formed by using a method substantially equal or similar to a method described above for the lower redistribution pattern 113.

After the upper redistribution structure 170 is formed, the carrier substrate CS may be separated from the lower redistribution structure 110. In some example embodiments, the carrier substrate CS may be separated from the lower redistribution structure 110 by using a laser lift-off method. Below, referring to FIGS. 5M and 5N, a method of separating the carrier substrate CS from the lower redistribution structure 110 by using a laser lift-off method is further described in detail.

Figure 5M:
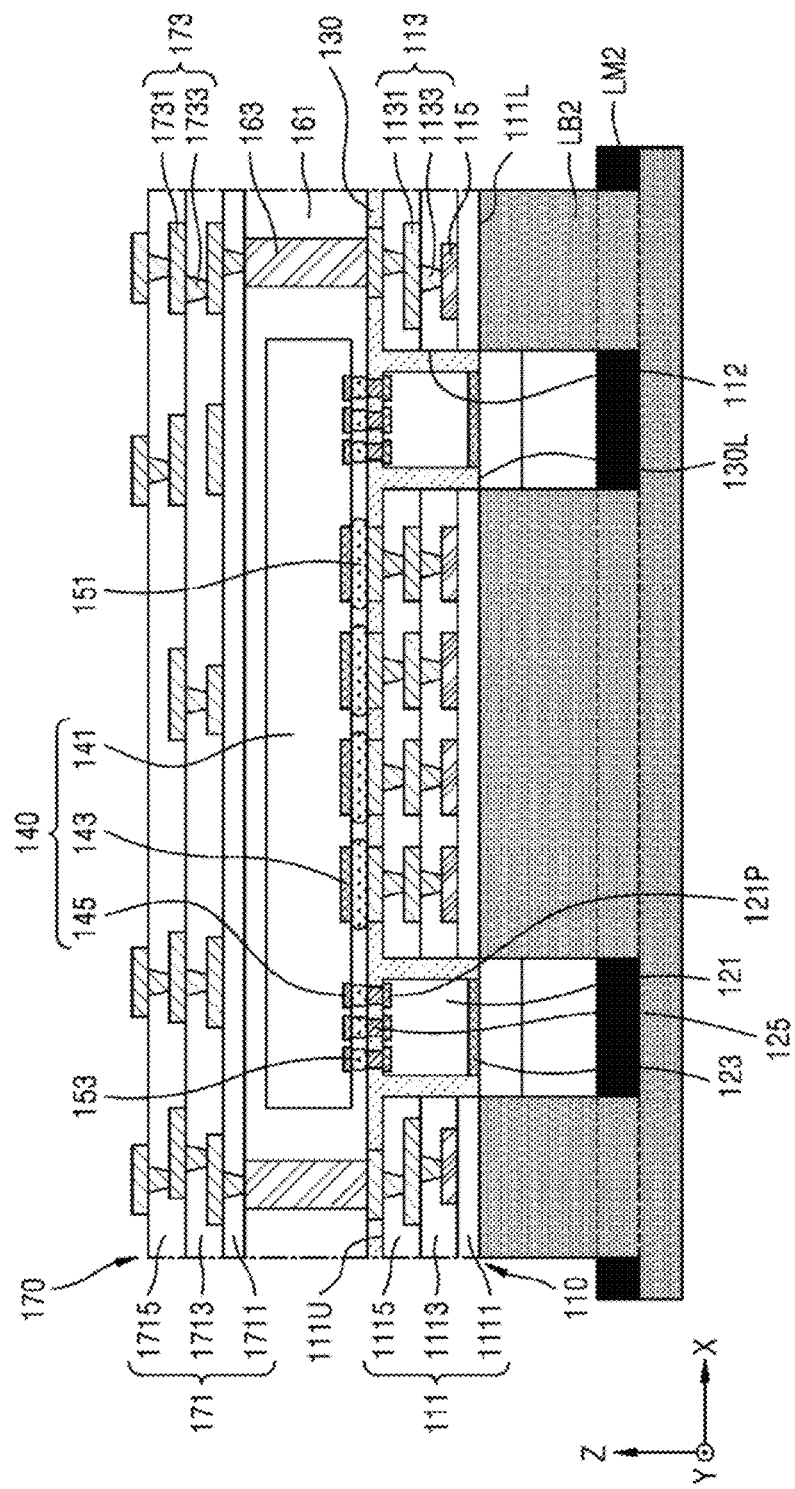

Referring to FIG. 5M, a second laser beam LB2 may be irradiated on the interface, through the carrier substrate CS, between the lower redistribution insulation layer 111 and the carrier substrate CS. The second laser beam LB2 may be irradiated on the interface between the lower redistribution insulation layer 111 and the carrier substrate CS, but may not be irradiated on an interface between the insulation filler 130 and the carrier substrate CS, and an interface between the adhesive film 123 and the carrier substrate CS. For example, the second laser beam LB2 may be selectively provided on local areas of the carrier substrate CS, by using a second beam mask LM2 configured to selectively transmit the second laser beam LB2. The second beam mask LM2 may allow (e.g., may enable) irradiation of the second laser beam LB2 on the interface between the lower redistribution insulation layer 111 and the carrier substrate CS, but may block irradiation of the second laser beam LB2 on an interface between the passive component 121 and the carrier substrate CS, and the interface between the insulation filler 130 and the carrier substrate CS. For example, an opening of the second beam mask LM2 selectively transmitting the second laser beam LB2 may be aligned with the interface between the lower redistribution insulation layer 111, which is the laser irradiation region, and the carrier substrate CS, in a proceeding direction of the second laser beam LB2. The second beam mask LM2 may include a metal or invar, which does not react to the second laser beam LB2 or has very small reactivity with respect to the second laser beam LB2. When the second laser beam LB2 is irradiated on the interface between the lower redistribution insulation layer 111 and the carrier substrate CS, an adhesion force between the lower redistribution insulation layer 111 and the carrier substrate CS may be reduced. The bottom surface 111L of the lower redistribution insulation layer 111 may be processed by the second laser beam LB2, and the surface roughness of the bottom surface 111L of the lower redistribution insulation layer 111 may increase.

Figure 5N:
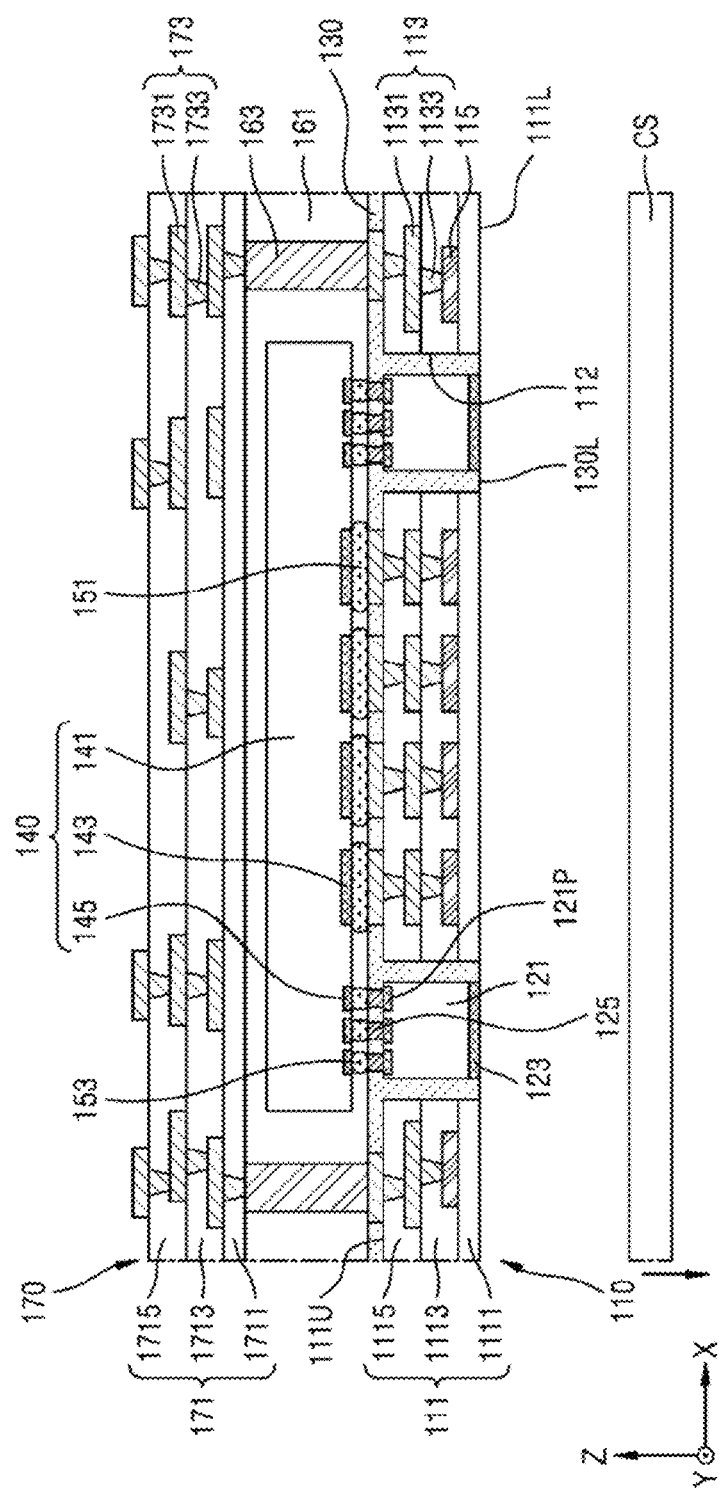
Figure 50:
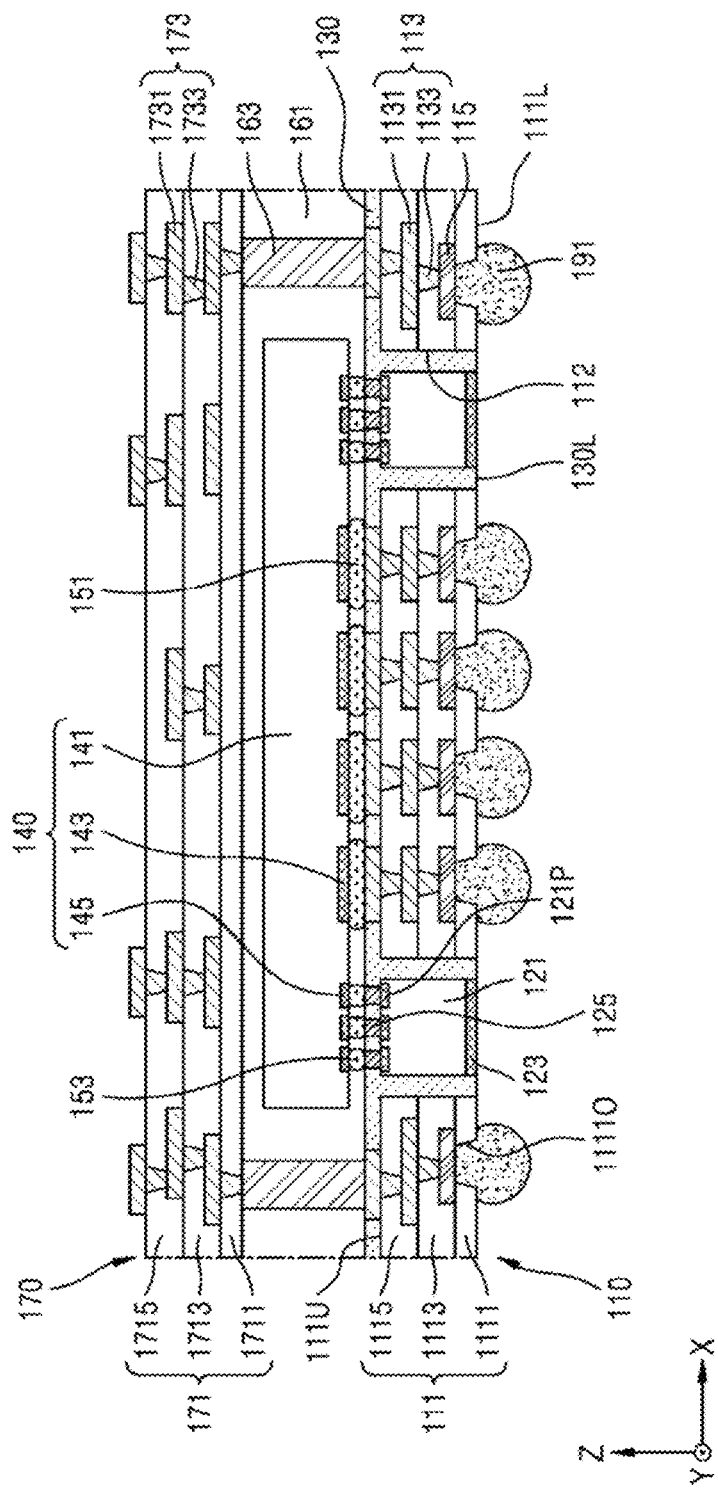

Referring to FIG. 5N, the carrier substrate CS may be separated from the bottom surface 111L of the lower redistribution insulation layer 111. When the carrier substrate CS is removed, the bottom surface 111L of the lower redistribution insulation layer 111, the bottom surface 130L of the insulation filler 130, and the adhesive film 123 may be exposed.

Referring to FIG. 5O, after the carrier substrate CS is separated from the lower redistribution structure 110 (e.g., subsequently to the carrier substrate CS being separated from the lower redistribution structure 110), the pad opening 1111O exposing a portion of the bottom surface 115L of the bump pad 115 may be formed in the first insulation layer 1111. The pad opening 1111O may extend from the bottom surface 111L of the lower redistribution insulation layer 111, which is exposed after the carrier substrate CS has been removed, to the bottom surface 115L of the bump pad 115. The pad opening 1111O may have a tapered shape, in which a horizontal width of the pad opening 1111O narrows toward the bottom surface of the bump pad 115. The pad opening 1111O may be formed, for example, by using an etching process.

After the pad opening 1111O is formed in the first insulation layer 1111, the external connection bump 191 attached to the bump pad 115 via the pad opening 1111O may be formed. The external connection bump 191 may be formed, for example, by using a solder ball attach process and a reflow process. After the external connection bump 191 is formed, a structure of FIG. 5O, which has been manufactured at a panel level by performing a sawing process, may be separated into the semiconductor packages 1000 in individual package units.

While the inventive concepts has been particularly shown and described with reference to embodiments thereof, it will be understood that various changes in form and details may be made therein without departing from the spirit and scope of the following claims.

What is claimed is:
1. A semiconductor package, comprising:
  a lower redistribution structure including
    a lower redistribution insulation layer,
    a bump pad in the lower redistribution insulation layer, and a lower redistribution pattern electrically connected to the bump pad, wherein the lower redistribution insulation layer includes one or more sidewalls at least partially defining a cavity extending from a bottom surface of the lower redistribution insulation layer to an upper surface of the lower redistribution insulation layer;

a passive component in the cavity of the lower redistribution insulation layer;

an insulation filler in the cavity of the lower redistribution insulation layer, the insulation filler covering sidewalls of the passive component;

a first semiconductor chip on the lower redistribution structure, the first semiconductor chip electrically connected to both the lower redistribution pattern and the passive component; and an external connection bump connected to the bump pad via a pad opening of the lower redistribution insulation layer, the external connection bump connected to the bottom surface of the lower redistribution insulation layer, wherein the insulation filler includes a bottom surface exposed to an exterior of the semiconductor package through the bottom surface of the lower redistribution insulation layer, wherein a surface roughness of the bottom surface of the lower redistribution insulation layer is greater than a surface roughness of the bottom surface of the insulation filler, and wherein the bottom surface of the insulation filler is at a same vertical level as a vertical level of the bottom surface of the lower redistribution insulation layer.

2. The semiconductor package of claim 1, further comprising:

an adhesive film attached to a bottom surface of the passive component, the adhesive film exposed to the exterior of the semiconductor package through the bottom surface of the lower redistribution insulation layer.

3. The semiconductor package of claim 1, further comprising:

a chip connection bump between
  a portion of the lower redistribution pattern on the upper surface of the lower redistribution insulation layer, and
  a first chip pad of the first semiconductor chip;

a conductive connection pillar on a connection pad of the passive component; and a component connection bump between the conductive connection pillar and a second chip pad of the first semiconductor chip.

4. The semiconductor package of claim 3, wherein
the insulation filler covers the upper surface of the lower redistribution insulation layer, and
an upper surface of the insulation filler is coplanar with an upper surface of the conductive connection pillar.

5. The semiconductor package of claim 1, wherein
a material of the lower redistribution insulation layer is different from a material of the insulation filler.

6. The semiconductor package of claim 1, wherein
the surface roughness of the bottom surface of the lower redistribution insulation layer is greater than a surface roughness of the upper surface of the lower redistribution insulation layer.

7. The semiconductor package of claim 1, wherein
a height of the external connection bump measured from the bottom surface of the lower redistribution insulation layer is equal to or less than 180 μm.

8. The semiconductor package of claim 1, wherein
the surface roughness of the bottom surface of the lower redistribution insulation layer is 20 nm to 200 nm.

9. The semiconductor package of claim 1, wherein
the bump pad includes
  a bottom surface contacting the external connection bump, and
  an upper surface,
the lower redistribution pattern comprises
  a lower redistribution via pattern contacting the upper surface of the bump pad, and
  a lower redistribution line pattern electrically connected to the bump pad via the lower redistribution via pattern, and
the lower redistribution via pattern has a tapered shape in which a horizontal width of the lower redistribution via pattern narrows toward the upper surface of the bump pad.

10. The semiconductor package of claim 9, wherein
in a cross-section view, the bump pad has a rectangular shape.

11. The semiconductor package of claim 9, wherein
the pad opening of the lower redistribution insulation layer has a tapered shape in which a horizontal width of the pad opening of the lower redistribution insulation layer narrows toward the bottom surface of the bump pad.

12. The semiconductor package of claim 1, further comprising:

a molding layer on the lower redistribution structure, the molding layer covering the first semiconductor chip;

a conductive post penetrating the molding layer, the conductive post electrically connected to the lower redistribution pattern; and an upper redistribution structure on the molding layer, the upper redistribution structure comprising an upper redistribution insulation layer and an upper redistribution pattern that is electrically connected to the conductive post.

13. The semiconductor package of claim 12, wherein
the upper redistribution pattern further comprises an upper redistribution via pattern contacting the conductive post, and
the upper redistribution via pattern has a tapered shape in which a horizontal width of the upper redistribution via pattern narrows toward the conductive post.

14. The semiconductor package of claim 12, further comprising:

a second semiconductor chip on the upper redistribution structure, the second semiconductor chip electrically connected to the upper redistribution pattern.

15. A semiconductor package, comprising:
a lower redistribution structure including
  a lower redistribution insulation layer,
  a bump pad in the lower redistribution insulation layer, and
  a lower redistribution pattern electrically connected to the bump pad,
  wherein the lower redistribution insulation layer includes one or more sidewalls at least partially defining a cavity extending from a bottom surface of the lower redistribution insulation layer to an upper surface of the lower redistribution insulation layer;

a passive component in the cavity of the lower redistribution insulation layer;

an insulation filler in the cavity of the lower redistribution insulation layer, the insulation filler covering sidewalls of the passive component;

a semiconductor chip on the lower redistribution structure, the semiconductor chip electrically connected to both the lower redistribution pattern and the passive component; and an external connection bump connected to the bump pad through a pad opening of the lower redistribution insulation layer, the external connection bump connected to the bottom surface of the lower redistribution insulation layer, wherein a surface roughness of the bottom surface of the lower redistribution insulation layer is greater than a surface roughness of the upper surface of the lower redistribution insulation layer, and wherein the surface roughness of the bottom surface of the lower redistribution insulation layer is 20 nm to 200 nm.

16. The semiconductor package of claim 15, further comprising:

an adhesive film covering a bottom surface of the passive component so that the bottom surface of the passive component is isolated from exposure to an exterior of the semiconductor package by at least the adhesive film, wherein the adhesive film is exposed to the exterior of the semiconductor package through the bottom surface of the lower redistribution insulation layer.

17. The semiconductor package of claim 15, further comprising:

a chip connection bump provided between the lower redistribution structure and a first chip pad of the semiconductor chip;

a conductive connection pillar attached to a connection pad of the passive component;

a component connection bump provided between the conductive connection pillar and a second chip pad of the semiconductor chip; and a molding layer on the lower redistribution structure, the molding layer covering the semiconductor chip, wherein the insulation filler covers sidewalls of the conductive connection pillar, and wherein the molding layer covers sidewalls of the component connection bump.

18. The semiconductor package of claim 17, further comprising:

a conductive post penetrating the molding layer, the conductive post electrically connected to the lower redistribution pattern; and an upper redistribution structure on the molding layer, the upper redistribution structure including an upper redistribution via pattern connected to the conductive post, wherein the lower redistribution structure includes a lower redistribution via pattern connected to the bump pad, and wherein each of the lower redistribution via pattern and the upper redistribution via pattern has a tapered shape in which a horizontal width thereof narrows toward the bottom surface of the lower redistribution insulation layer.

19. The semiconductor package of claim 15, wherein, in a cross-sectional view, the bump pad has a rectangular shape, wherein, in another cross-sectional view, the pad opening of the lower redistribution insulation layer has a tapered shape in which a horizontal width thereof narrows toward the bump pad, and wherein a portion of the external connection bump fills the pad opening of the lower redistribution insulation layer.

20. A semiconductor package, comprising:

a lower package and an upper package stacked on the lower package, wherein the lower package includes a lower redistribution structure that includes
a lower redistribution insulation layer,
a bump pad in the lower redistribution insulation layer, and
a lower redistribution pattern electrically connected to the bump pad,
wherein the lower redistribution insulation layer includes one or more sidewalls at least partially defining a cavity extending from a bottom surface of the lower redistribution insulation layer to an upper surface of the lower redistribution insulation layer;

a passive component in the cavity of the lower redistribution insulation layer;

an insulation filler in the cavity of the lower redistribution insulation layer, the insulation filler covering sidewalls of the passive component;

a first semiconductor chip on the lower redistribution structure, the first semiconductor chip electrically connected to both the lower redistribution pattern and the passive component;

a chip connection bump between the lower redistribution structure and a first chip pad of the first semiconductor chip;

a conductive connection pillar attached to a connection pad of the passive component;

a component connection bump between the conductive connection pillar and a second chip pad of the first semiconductor chip;

a molding layer on the lower redistribution structure, the molding layer covering the first semiconductor chip;

a conductive post penetrating the molding layer, the conductive post electrically connected to the lower redistribution pattern;

an upper redistribution structure on the molding layer, the upper redistribution structure including
an upper redistribution insulation layer, and
an upper redistribution pattern electrically connected to the conductive post; and an external connection bump connected to the bump pad through a pad opening of the lower redistribution insulation layer, the external connection bump connected to the bottom surface of the lower redistribution insulation layer, wherein the upper package includes
a package substrate stacked on the upper redistribution structure via an inter-package connection terminal, and
a second semiconductor chip on the package substrate, wherein the insulation filler includes a bottom surface exposed to an exterior of the semiconductor package through the bottom surface of the lower redistribution insulation layer, and wherein a surface roughness of the bottom surface of the lower redistribution insulation layer is greater than both a surface roughness of the bottom surface of the insulation filler and a surface roughness of the upper surface of the lower redistribution insulation layer.

* * * * *